US010763879B1

(12) United States Patent
Neto

(10) Patent No.: US 10,763,879 B1
(45) Date of Patent: Sep. 1, 2020

(54) LOW POWER AND HIGH-SPEED CIRCUIT FOR GENERATING ASYNCHRONOUS CLOCK SIGNALS

(71) Applicant: Xilinx, Inc., San Jose, CA (US)

(72) Inventor: Pedro W. Neto, Douglas (IE)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/526,000

(22) Filed: Jul. 30, 2019

(51) Int. Cl.
*G06F 1/04* (2006.01)
*H03M 1/12* (2006.01)
*H03M 1/46* (2006.01)

(52) U.S. Cl.
CPC ........... *H03M 1/125* (2013.01); *H03M 1/462* (2013.01); *H03M 1/466* (2013.01)

(58) Field of Classification Search
CPC ....... H03M 1/125; H03M 1/462; H03M 1/466
USPC ........................................................ 327/291
See application file for complete search history.

(56) References Cited

U.S. PATENT DOCUMENTS

| 8,970,419 | B2 | 3/2015 | Farley et al. | |
| 9,503,058 | B1 | 11/2016 | Cical et al. | |
| 10,236,901 | B1 | 3/2019 | Neto | |
| 2012/0212356 | A1* | 8/2012 | Killat | H03M 1/125 341/110 |
| 2017/0201268 | A1* | 7/2017 | Sharma | H03M 1/1245 |

OTHER PUBLICATIONS

Bob Verbruggen, Masao Iriguchi, and Jan Craninckx, A 1.7 mW 11b 250 MS/s 2-Times Interleaved Fully Dynamic Pipelined SAR ADC in 40 nm Digital CMOS, IEEE Journal of Solid-State Circuits, Dec. 2012, 8 pages, vol. 47, No. 12, San Francisco, CA, USA.
Young-Deuk Jeon, Young-Kyun Cho, Jae-Won Nam, Kwi-Dong Kim, Woo-Yol Lee, Kuk-Tae Hong, and Jong-Kee Kwon, A 9.15mW 0.22mm2 10b 204MS/s Pipelined SAR ADC in 65nm CMOS, IEEE, 2010, 4 pages, San Jose, CA, USA.
Chun-Cheng Liu, Soon-Jyh Chang, Guan-Ying Huang, and Ying-Zu Lin, A 10-bit 50-MS/s SAR ADC With a Monotonic Capacitor Switching Procedure, IEEE Journal of Solid-State Circuits, Apr. 2010, 10 Pages, vol. 45, No. 4, USA.

(Continued)

*Primary Examiner* — Metasebia T Retebo
(74) *Attorney, Agent, or Firm* — Craige Thompson, Thompson Patent Law

(57) ABSTRACT

Apparatus and associated methods relate to a clock generation circuit which generates asynchronous clock signals for a successive approximation ADC architecture based on time-interleaved comparators. In an illustrative example, a circuit may include (a) a first comparator configured to receive an input signal and generate a first ready signal to indicate a comparison decision being complete, (b) a second comparator configured to receive the input signal and generate a second ready signal to indicate a comparison decision being complete, and (c) a clock generation circuit coupled to receive the first and the second ready signals and generate a first clock for the first comparator and a second clock for the second comparator. The first and the second clock signals may be in anti-phase. Thus, each comparator may have enough time to reach a valid comparison in each successive approximation cycle, and kickback noises at comparator' inputs may be advantageously reduced.

16 Claims, 10 Drawing Sheets

(56) References Cited

OTHER PUBLICATIONS

Samuel Palermo, Sebastian Hoyos, Ayman Shafik, Ehsan Zhian Tabasy, Shengchang Cai, Shiva Kiran, and Keytaek Lee, CMOS ADC-Based Receivers for High-Speed Electrical and Optical Links, IEEE Communications Magazine, Oct. 2016, 8 pages, USA.

Jen-Huan Tsai, Hui-Huan Wang, Yang-Chi Yen, Chang-Ming Lai, Yen-Ju Chen, Po-Chuin Huang, Ping-Hsuan Hsieh, Hsin Chen, and Chao-Cheng Lee, A 0.003 mm2 10 b 240 MS/s 0.7 mW SAR ADC in 28 CMOS With Digital Error Correction and Correlated-Reversed Switching, IEEE Journal of Solid-State Circuits, Jun. 2015, 17 pages, vol. 50, No. 6, USA.

Kalmeshwar N. Hosur, Girish V. Attimarad, Harish M. Kittur, and S. S. Kerur, Design and simulation of Low Power Successive Approximation Register for A/D Converters using 0.18um CMOS Technology, International Journal of Engineering and Technology (IJET), May 2016, 9 pages, vol. 8, No. 2, India.

Lukas Kull, Thomas Toifl, Martin Schmatz, Pier Andrea Francese, Christian Menolfi, Matthias Braendli, Marcel Kossel, Thomas Morf, Toke Meyer Andersen, and Yusuf Leblebici, 3.1 mW 8b 1.2 GS/s Single-Channel Asynchronous SAR ADC With Alternate Comparators for Enhanced Speed in 32 nm Digital SOI CMOS, IEEE Journal of Solid-State Circuits, Dec. 2013, 10 Pages, vol. 48, No. 12.

Lukas Kull, Thomas Toifl, Martin Schmatz, Pier Andrea Francese, Christian Menolfi, Matthias Braendli, Marcel Kossel, Thomas Morf, Toke Meyer Andersen, Yusuf Leblebici, A 90GS/s 8b 667mW 64× Interleaved SAR ADC in 32nm Digital SOI CMOS, 2014 IEEE International Solid-State Circuits Conference, 3 pages, San Francisco, CA.

\* cited by examiner

LOW POWER AND HIGH-SPEED CIRCUIT FOR GENERATING ASYNCHRONOUS CLOCK SIGNALS

TECHNICAL FIELD

Various embodiments relate generally to integrated circuits (ICs), and more specifically, to analog-to-digital converters (ADCs).

BACKGROUND

Communication systems transport data from a transmitter to a receiver over a data link. Before transmission, data may be encoded in analog or digital formats. Some communication systems may modulate a carrier signal to carry the data information from the transmitter to the receiver. At the receiver, data may be recovered by demodulating the received signal.

Data links that transport data may be wired or wireless. Wired communication systems may include telephone networks, cable television, internet service provider, and fiber-optic communication nodes, for example. Wireless data links may transfer information between two or more points that are not connected by an electrical conductor. Wireless data links may transport data by using electromagnetic waves propagating through a medium, such as air or free space. Some wireless links may transport information in the form of light.

At a receiver in a digital communication system, a digitally-encoded data stream may be received as an analog signal and converted to a digital format by an analog-to-digital converter (ADC). The ADC interprets the data stream as a function of time. For example, some ADCs may be synchronized to a clock signal that determines when a voltage signal is to be sampled.

SUMMARY

Apparatus and associated methods relate to a clock generation circuit which generates asynchronous clock signals for a successive approximation ADC architecture based on time-interleaved comparators. In an illustrative example, a circuit may include (a) a first comparator configured to receive an input signal and generate a first ready signal to indicate a comparison decision being complete, (b) a second comparator configured to receive the input signal and generate a second ready signal to indicate a comparison decision being complete, and (c) a clock generation circuit coupled to receive the first and the second ready signals and generate a first clock for the first comparator and a second clock for the second comparator. The first and the second clock signals may be in anti-phase. Thus, each comparator may have enough time to reach a valid comparison in each successive approximation cycle, and kickback noises at comparator' inputs may be advantageously reduced.

Various embodiments may achieve one or more advantages. For example, some embodiments may use stop signals received from a successive approximation register (SAR) logic circuit to control the clocks used for the comparators. When the stop signal stopa is high, the first clock signal cka clock oscillation may be stopped. When the stop signal stopb is high, the second clock signal ckb clock oscillation may be stopped. Thus, the number of clock cycles (resolution) used in the SAR conversion may be controlled by the stop signals and may be programmable. In some embodiments, unemployed comparators in the comparator system may be disabled, which may advantageously reduce the power consumption of the ADC.

In some embodiments, the clock generation circuit may be divided into two half-cells. Thus, the asynchronous clock generation circuit may be placed inside the comparators to minimize the stray capacitance on critical nets rdya and rdyb. In some embodiments, by placing resistors on the supplies of the delay lines in the clock generation circuit, low power operation may be achieved due to the limitation of the maximum current through the logic gates. Moreover, by making the resistance on the NAND gate $ND_0$ and $ND_1$ variable, variable fall time delay may be available, and the total delay in the clock generation circuit may be controlled.

In some embodiments, by introducing the clock generation circuit, comparison completeness (ready signals rdya, rdyb) of comparators may be monitored to generate corresponding clock signals. Thus, one comparator may be reset during the active phase of the other compactor. Accordingly, comparator reset time may be removed from the clock generation loop to advantageously reduce SAR conversion cycles. And high-speed operation of the ADC may be achieved.

In some embodiments, sizes of transistors in the clock generation circuit may be selected to make the rising/falling edge of first clock signal cka as close to the falling/rising edge of the second clock signal ckb as possible. For example, all the transistors (e.g., $M_{N0}$-$M_{N6}$, $M_{P0}$-$M_{P6}$) may have the same size. Thus, rising and falling waveforms for the first clock signal cka and the second clock signal ckb may be as close from simultaneous as possible to generate symmetrical/differential kickback noise at the comparator inputs and mitigate the common mode variations related to the kickback noise.

In one exemplary aspect, a circuit includes (a) a first comparator configured to receive an input signal and generate a first ready signal to indicate a comparison decision being complete, (b) a second comparator configured to receive the input signal and generate a second ready signal to indicate a comparison decision being complete, and, (c) a clock generation circuit configured to receive the first ready signal and the second ready signal and generate a first clock signal for the first comparator and a second clock signal for the second comparator, the first clock signal and the second clock signal are out of phase, and transitions of the first clock signal and the second clock signal are temporally aligned.

In some embodiments, the first comparator and the second comparator may include time-interleaved comparators. In some embodiments, the clock generation circuit may be controlled by an oscillation start signal. In some embodiments, the clock generation circuit may be configured to receive a first stop signal to stop the generation of the first clock signal. In some embodiments, the clock generation circuit may be also configured to receive a second stop signal to stop the generation of the second clock signal. In some embodiments, the first stop signal and the second stop signal may be generated by a successive approximation register (SAR) logic circuit of an analog-to-digital converter (ADC). In some embodiments, the clock generation circuit may be configured to receive a control signal to control transitions of the first clock signal and the second clock signal.

In some embodiments, the clock generation circuit may include (1) a first circuit configured to generate the second clock signal in response to the first ready signal, the second ready signal, and an inverted oscillation start signal, and, (2) a second circuit configured to generate the first clock signal in response to the first ready signal the second ready signal, and the oscillation start signal. In some embodiments, the first circuit may include a first stop circuit comprising a first transmission gate configured to receive the first ready signal. The first transmission gate may include a first NMOSFET configured to receive an output of a first NOR gate, and a first PMOSFET configured to receive an inverted output of the first NOR gate. The first NOR gate may be configured to receive the inverted oscillation start signal and the second stop signal.

In some embodiments, the first circuit may include (a) a first NAND gate coupled to an output of a second stop circuit, the second stop circuit may include a second transmission gate configured to receive the second ready signal, the second transmission gate may include a second NMOSFE configured to receive an output of a second NOR gate, and a second PMOSFET may be configured to receive an inverted output of the second NOR gate, the second NOR gate may be configured to receive the inverted oscillation start signal and the first stop signal. The first circuit may include (b) a third NMOSFET, the gate of the third NMOSFET may be coupled to the output of the first transmission gate, and the source of the third NMOSFET may be coupled to a reference voltage, (c) a third PMOSFET, the source of the third PMOSFET may be coupled to a power supply voltage, (d) a plurality of inverters arranged between an output of the first NAND gate and the gate of the third PMOSFET, (e) a fourth PMOSFET, the source of the fourth PMOSFET may be coupled to the drain of the third PMOSFET, the gate of the fourth PMOSFET may be coupled to the output of the first NAND gate, and the drain of the fourth PMOSFET may be coupled to the drain of the third NMOSFET, and, (f) a second NAND gate configured to generate the second clock signal, one input of the second NAND gate may be coupled to the drain of the fourth PMOSFET, and the other input of the second NAND gate may be configured to receive the oscillation start signal.

In some embodiments, the first circuit may include a fourth NMOSFET, the gate of the fourth NMOSFET may be coupled to receive the inverted oscillation start signal, the source of the fourth NMOSFET may be coupled to the reference voltage, and the drain of the fourth NMOSFET may be coupled to the drain of the fourth PMOSFET. In some embodiments, the first circuit may include a variable resistor having two terminals, one of the two terminals may be coupled to the reference voltage, and the other terminal of the two terminals may be coupled to the first NAND gate, the resistance of the variable resistor may be controlled by the control signal. In some embodiments, the second circuit may include (a) a third NAND gate having a first input and a second input, the first input may be coupled to an output of the first stop circuit, and the second input may be coupled to receive the inverted oscillation start signal; (b) a fifth NMOSFET, wherein the gate of the fifth NMOSFET may be coupled to the output of the second transmission gate, and the source of the fifth NMOSFET may be coupled to the reference voltage; (c) a fifth PMOSFET, the source of the fifth PMOSFET may be coupled to the power supply voltage; (d) a plurality of inverters arranged between an output of the third NAND gate and the gate of the fifth PMOSFET; (e) a sixth PMOSFET, the source of the sixth PMOSFET may be coupled to the drain of the fifth PMOSFET, the gate of the sixth PMOSFET may be coupled to the output of the third NAND gate, and the drain of the fifth PMOSFET may be coupled to the drain of the fifth NMOSFET; and, (f) a fourth NAND gate configured to generate the first clock signal, wherein both two inputs of the fourth NAND gate may be coupled to the drain of the fifth NMOSFET.

In another exemplary aspect, a method includes (a) providing a first comparator to receive an input signal and generate a first ready signal to indicate a comparison decision being complete; (b) providing a second comparator to receive the input signal and generate a second ready signal to indicate a comparison decision being complete; (c) providing a clock generation circuit configured to receive the first ready signal and the second ready signal; and, (d) generating, by the clock generation circuit, a first clock signal for the first comparator and a second clock signal for the second comparator, the first clock signal and the second clock signal are out of phase, and transitions of the first clock signal and the second clock signal are temporally aligned.

In some embodiments, the first comparator and the second comparator may include time-interleaved comparators. In some embodiments, the clock generation circuit may be controlled by an oscillation start signal. In some embodiments, the method may include receiving, by the clock generation circuit, a first stop signal to stop the generation of the first clock signal. In some embodiments, the method may include receiving, by the clock generation circuit, a second stop signal to stop the generation of the second clock signal. In some embodiments, the method may include generating, by a successive approximation register (SAR) logic circuit of an analog-to-digital converter (ADC), the first stop signal and the second stop signal. In some embodiments, the method may include receiving, by the clock generation circuit, a control signal to control transitions of the first clock signal and the second clock signal.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

Apparatus and associated methods relate to a clock generation circuit which generates asynchronous clock signals for a successive approximation ADC architecture based on time-interleaved comparators. In an illustrative example, a circuit may include (a) a first comparator configured to receive an input signal and generate a first ready signal to indicate a comparison decision being complete, (b) a second comparator configured to receive the input signal and generate a second ready signal to indicate a comparison decision being complete, and (c) a clock generation circuit coupled to receive the first and the second ready signals and generate a first clock for the first comparator and a second clock for the second comparator. The first and the second clock signals may be in anti-phase. Thus, each comparator may have enough time to reach a valid comparison in each successive approximation cycle, and kickback noises at comparator' inputs may be advantageously reduced.

Figure 5:
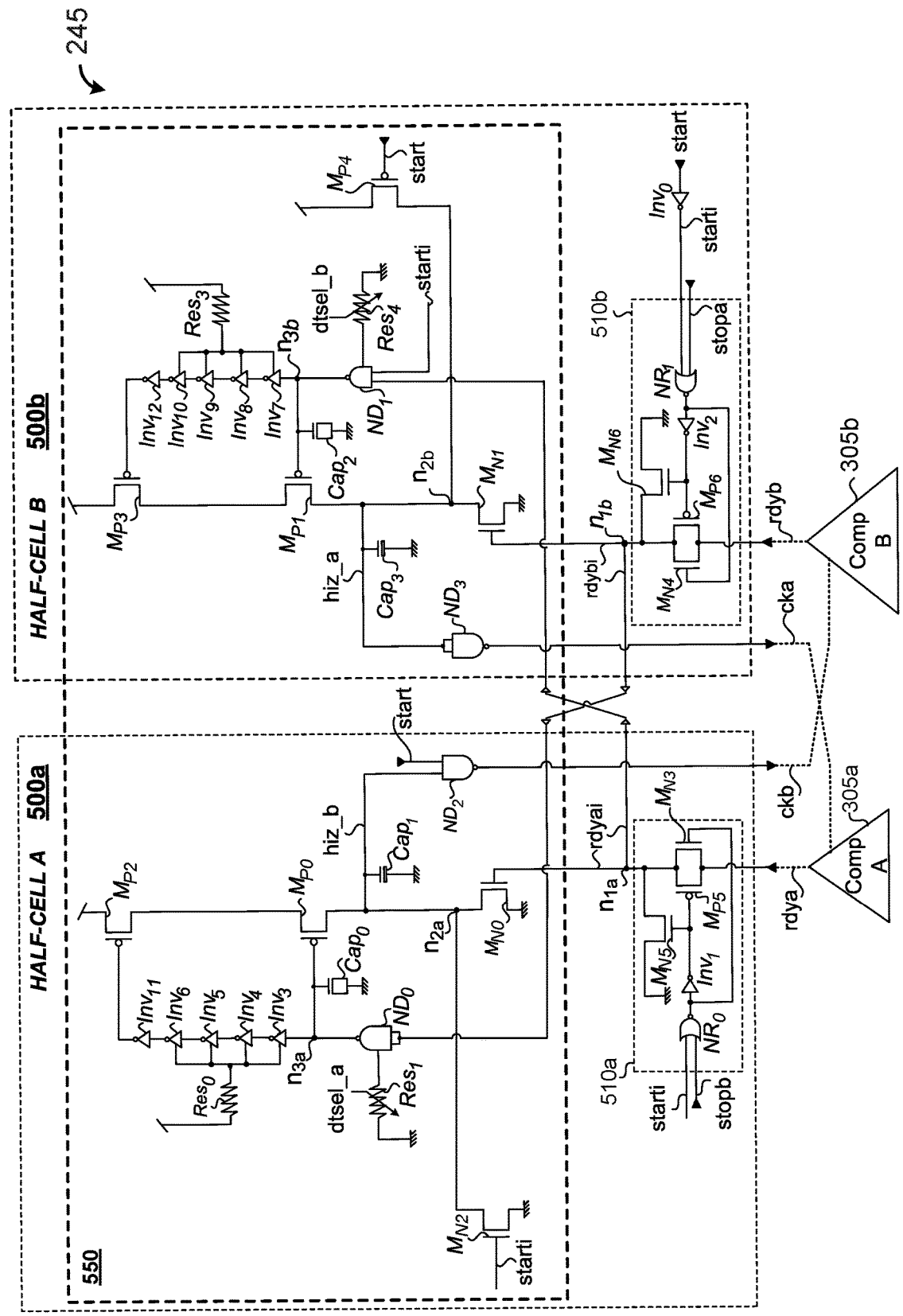
FIG. 5 depicts an architecture of an exemplary clock generation circuit used to generate the asynchronous clock signals.
Figure 6:
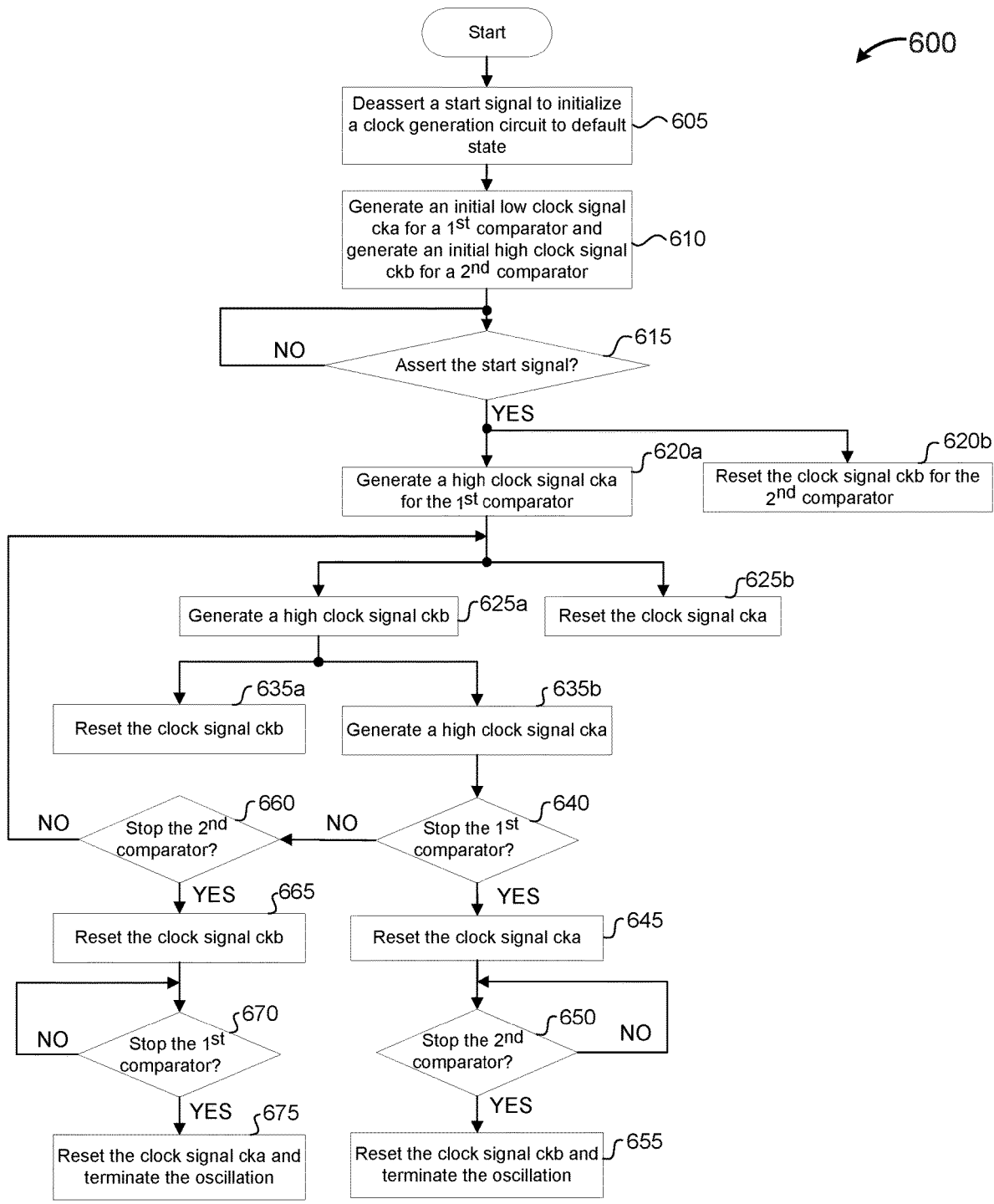
FIG. 6 depicts a flow chart of an exemplary method to operate the circuit described with reference to FIG. 5.
Figure 7:
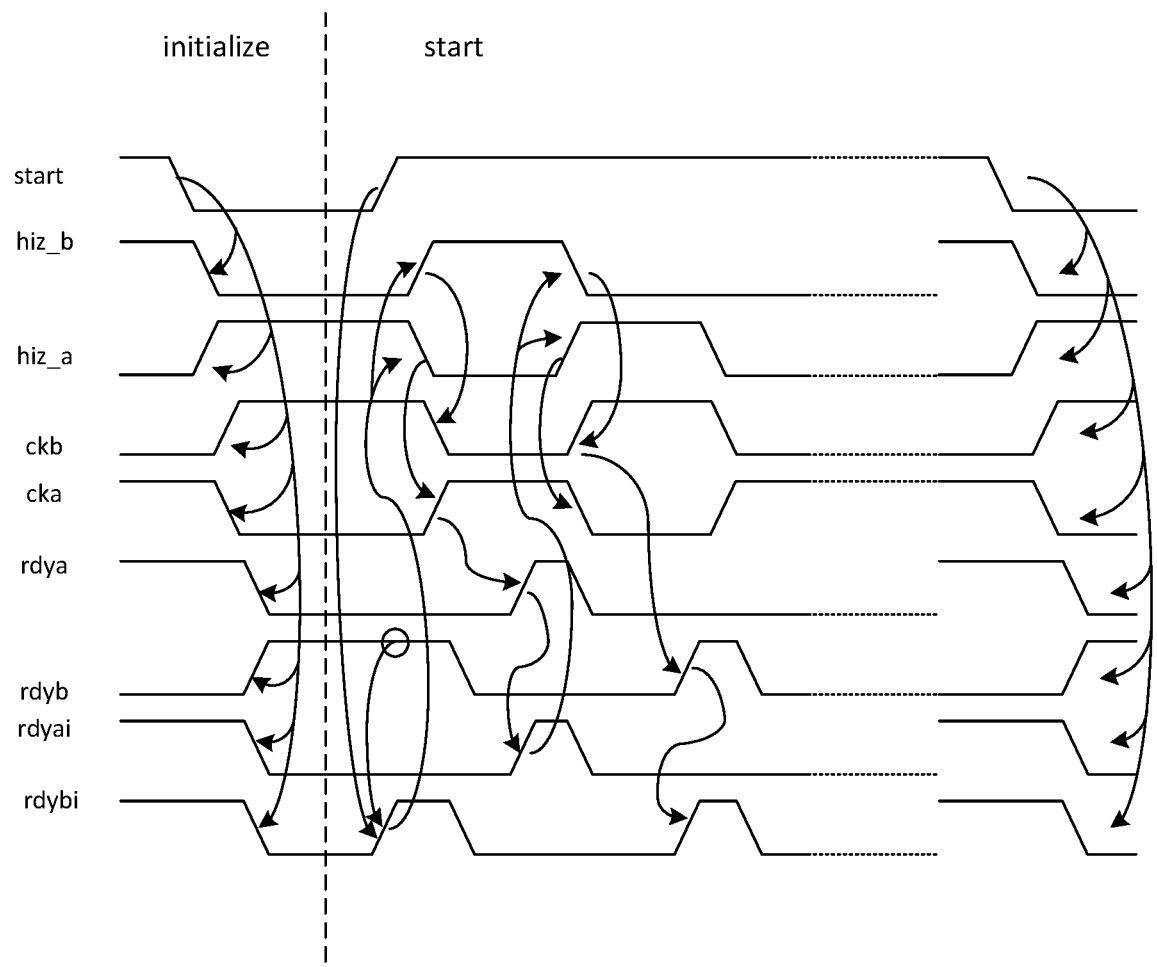
FIG. 7 depicts timing diagrams of exemplary signals in the clock generation circuit described with reference to FIG. 5.

To aid understanding, this document is organized as follows. First, an exemplary platform (e.g., FPGA) suitable to perform data communication and signal conversion is briefly introduced with reference to FIG. 1. Second, with reference to FIGS. 2-4B, time-interleaved comparators that implementing two asynchronous clock signals are discussed. With reference to FIGS. 5-7, the discussion turns to exemplary embodiments that illustrate a clock generation circuit which generates asynchronous clock signals for the time-interleaved comparators, exemplary methods to operate the clock generation circuit, and key timing diagrams of signals in the clock generation circuit. Finally, with reference to FIG. 8, another exemplary platform (e.g., SOC) suitable to perform data communication and signal conversion is briefly introduced.

Figure 1:
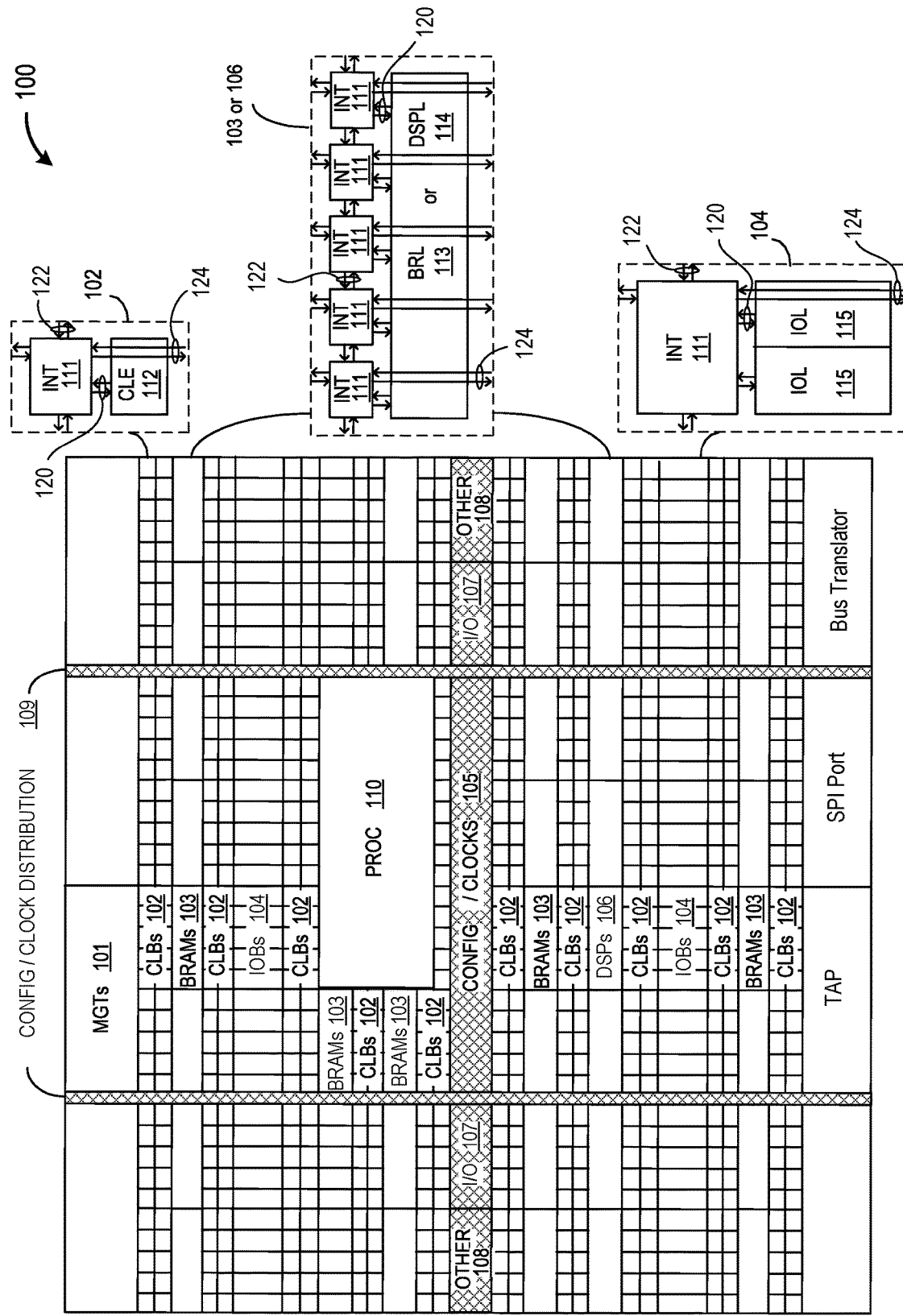
FIG. 1 depicts an exemplary programmable integrated circuit (IC) on which the disclosed circuits and processes may be implemented.

FIG. 1 depicts an exemplary programmable integrated circuit (IC) on which the disclosed circuits and processes may be implemented. A programmable IC 100 includes FPGA logic. The programmable IC 100 may be implemented with various programmable resources and may be referred to as a System on Chip (SOC). Various examples of FPGA logic may include several diverse types of programmable logic blocks in an array.

For example, FIG. 1 illustrates a programmable IC 100 that includes a large number of different programmable tiles including multi-gigabit transceivers (MGTs) 101, configurable logic blocks (CLBs) 102, blocks of random access memory (BRAMs) 103, input/output blocks (IOBs) 104, configuration and clocking logic (CONFIG/CLOCKS) 105, digital signal processing blocks (DSPs) 106, specialized input/output blocks (I/O) 107 (e.g., clock ports), and other programmable logic 108 (e.g., digital clock managers, analog-to-digital converters, system monitoring logic). The programmable IC 100 includes dedicated processor blocks (PROC) 110. The programmable IC 100 may include internal and external reconfiguration ports (not shown).

In various examples, a serializer/deserializer may be implemented using the MGTs 101. The MGTs 101 may include various data serializers and deserializers. Data serializers may include various multiplexer implementations. Data deserializers may include various demultiplexer implementations.

In some examples of FPGA logic, each programmable tile includes a programmable interconnect element (INT) 111 having standardized inter-connections 124 to and from a corresponding interconnect element in each adjacent tile. Therefore, the programmable interconnect elements taken together implement the programmable interconnect structure for the illustrated FPGA logic. The programmable interconnect element INT 111 includes the intra-connections 120 to and from the programmable logic element within the same tile, as shown by the examples included in FIG. 1. The programmable interconnect element INT 111 includes the inter-INT-connections 122 to and from the programmable interconnect element INT 111 within the same tile, as shown by the examples included in FIG. 1.

For example, a CLB 102 may include a configurable logic element (CLE) 112 that may be programmed to implement user logic, plus a single programmable interconnect element INT 111. A BRAM 103 may include a BRAM logic element (BRL) 113 and one or more programmable interconnect elements. In some examples, the number of interconnect elements included in a tile may depend on the height of the tile. In the pictured implementation, a BRAM tile has the same height as five CLBs, but other numbers (e.g., four) may also be used. A DSP tile 106 may include a DSP logic element (DSPL) 114 and one or more programmable interconnect elements. An IOB 104 may include, for example, two instances of an input/output logic element (IOL) 115 and one instance of the programmable interconnect element INT 111. The actual I/O bond pads connected, for example, to the I/O logic element 115, may be manufactured using metal layered above the various illustrated logic blocks, and may not be confined to the area of the input/output logic element 115.

In the pictured implementation, a columnar area near the center of the die (shown shaded in FIG. 1) is used for configuration, clock, and other control logic. Horizontal areas 109 extending from the column distribute the clocks and configuration signals across the breadth of the programmable IC 100. Note that the references to "columnar" and "horizontal" areas are relative to viewing the drawing in a portrait orientation.

Some programmable ICs utilizing the architecture illustrated in FIG. 1 may include additional logic blocks that disrupt the regular columnar structure making up a large part of the programmable IC. The additional logic blocks may be programmable blocks and/or dedicated logic. For example, the processor block PROC 110 shown in FIG. 1 spans several columns of CLBs 102 and BRAMs 103.

FIG. 1 illustrates an exemplary programmable IC architecture. The numbers of logic blocks in a column, the relative widths of the columns, the number and order of columns, the types of logic blocks included in the columns, the relative sizes of the logic blocks, and the interconnect/logic implementations are provided purely as examples. For example, in an actual programmable IC, more than one adjacent column of CLBs 102 may be included wherever the CLBs 102 appear, to facilitate the efficient implementation of user logic.

Integrated circuits (IC) (e.g., FPGA)), such as the programmable IC 100, for example, may be used in a communication system to support various data communication protocols over wide frequency ranges while using progressively smaller areas. In various examples, analog signal levels may be converted into digital voltages, digital currents or digital charge signals using an analog-to-digital converter (ADC). Successive-approximation-register (SAR) ADC is a type of ADC that may convert a continuous analog waveform into a discrete digital representation via, for example, a binary search, through all possible quantization levels before finally converging upon a digital output for each conversion. Time-interleaved comparators may be used to generate internal delays and add margin to the total conversion cycle that each comparator may have enough time to reach a valid comparison successive approximation (SA) cycle.

Figure 2:
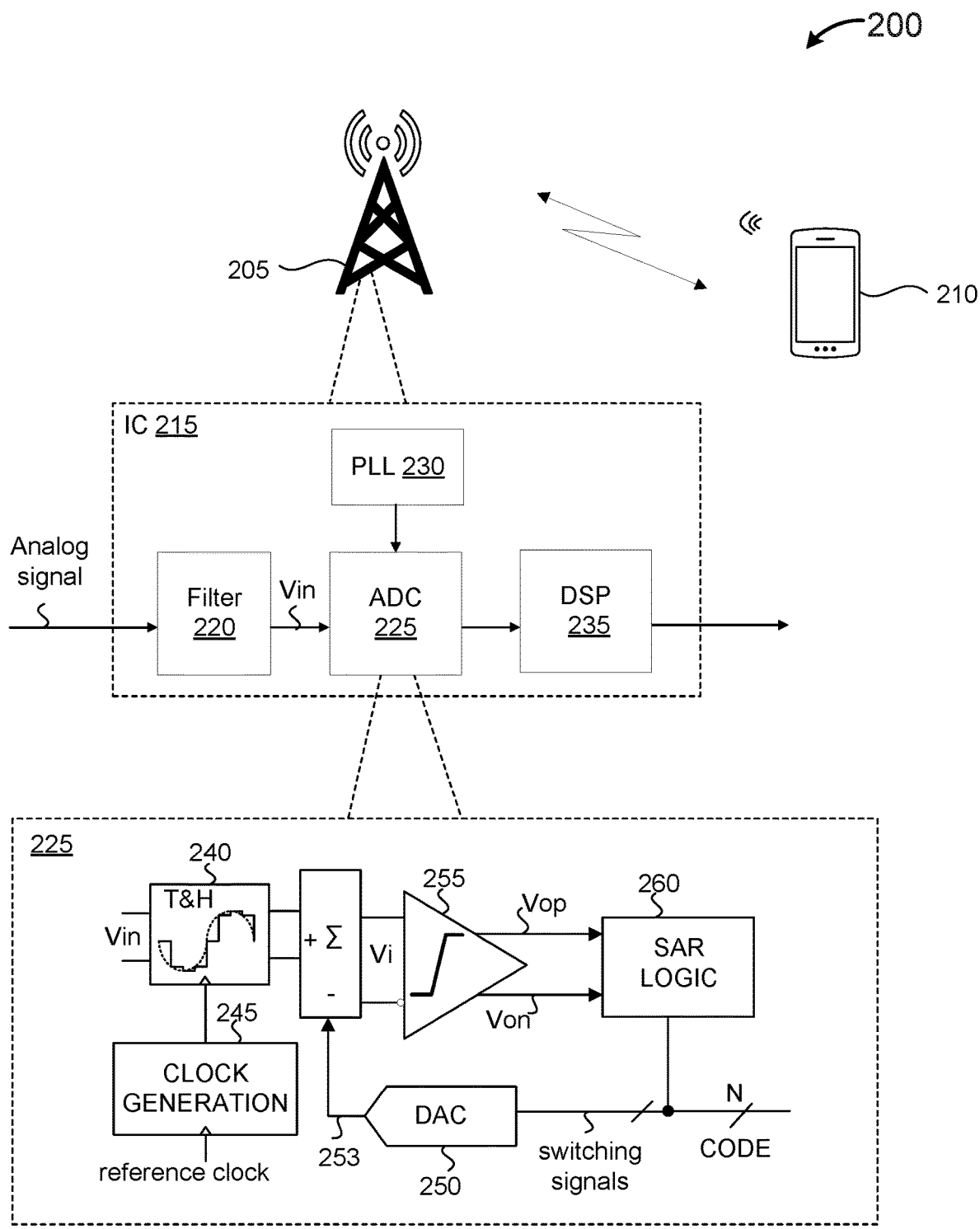
FIG. 2 depicts an analog-to-digital converter (ADC) having an exemplary clock generation circuit implemented in an IC.

FIG. 2 depicts an analog-to-digital converter (ADC) having an exemplary clock generation circuit implemented in an IC. In this depicted example, a communication system 200 includes a base station 205 to transmit and/or receive data from some data communication devices. In this example, the base station 205 receives an analog signal from a portable communication device 210 (e.g., cell phone). The base station 205 includes an integrated circuit (IC) 215 to perform data communications through an antenna (not shown) between the base station 205 and the cell phone 210. For example, IC 215 includes a filter (e.g., a low-pass filter) 220 to filter noises in the analog signal. An analog-to-digital converter (ADC) 225 may sample and convert the filtered analog signal into a digital signal. The sampling and conversion may be controlled by different clock signals. A phase-locked-loop (PLL) 230 may be used to provide the clock signals. The digital signal may be then processed by a digital signal processor (DSP) 235, for example.

In this illustrative example, the ADC 225 is an N-bit SAR ADC where output code (e.g., the digital signal) of the ADC 225 is defined during N successive approximation cycles (SA cycles), with N being the SAR number of bits. The total conversion cycle duration, in an N-bit SAR ADC, may be at least N successive approximation cycles plus one tracking period. In each SA cycle, the difference between a sampled input and an internal digital-to-analog converter (DAC) output may be compared against zero. If the difference is positive, a bit one may be attributed to the correspondent SA cycle, and the DAC may increase its output magnitude. If the difference is negative, the corresponding SA cycle bit may be zero and the DAC output magnitude may be reduced.

In this depicted example, the SAR ADC 225 includes a track and hold circuit 240 used to perform sample and hold operations on a differential incoming signal Vin (e.g., the filtered analog signal) to generate a differential sampled signal during a sample stage. A clock generation circuit 245 may be used to generate sampling clock signals for the track and hold circuit 240. The SAR ADC 225 also includes an N−1 bits digital-to-analog converter (DAC) 250 to generate a quantization signal 253 according to N−1 switch control signals. In some embodiments, the DAC 250 may be a charge redistribution DAC (CDAC).

The SAR ADC 225 also includes a comparator system 255. In some embodiments, the comparator system 255 may include one or more (e.g., 2, 3, . . . N) differential dynamic comparators. In some embodiments, the clock generation circuit 245 may also generate clock signals for the one or more differential dynamic comparators in the comparator system 255. For example, when the comparator system 255 includes two differential dynamic comparators, the clock generation circuit 245 may generate two asynchronous clock signals to dynamically enable one of the two comparators at a rising edge of a corresponding clock signal.

The comparator system 255 may selectively enable one or more (e.g., 2, 3, . . . , N, for example) differential dynamic comparators to compare the sampled signal with the quantization signal 253 (the comparator system 255 receives a differential signal Vi as input) to generate a comparison signal (e.g., a differential comparison signal having a first differential comparison signal Vop and a second differential comparison signal Von) to a successive-approximation-register (SAR) logic circuit 260. The SAR logic circuit 260 may be used for successively changing the content of the switch control signals during a voltage comparison stage to vary the quantization signal 253, enabling the next SA cycle and stop the conversion cycle after the last conversion, and successively receiving the differential comparison signal Vop, Von to generate an N-bit digital output code.

In a SAR conversion cycle, each SA cycle may have a variable minimum duration due to the comparator variable delay. Comparators in the comparator system 255 may be used to generate indication signals (e.g., ready signals) when a valid data is available at the comparator's output, thus comparator variable delay may be included in the clock generation loop, in such a way, each comparator may only use the time it needs to generate the valid output, and each SA cycles may be faster. The clock generation circuit 245 may be used to generate asynchronous clock signals for the SAR ADC 225 based on time-interleaved comparators. The asynchronous clock signals for two time-interleaved comparators may be anti-phased to reset one of the two comparators during the active phase of the other comparator. By reducing or substantially eliminating comparator reset time from the clock generation loop, SA loop duration may be reduced even further to reduce SAR conversion time and thus achieve high-speed ADCs.

Figure 3A:
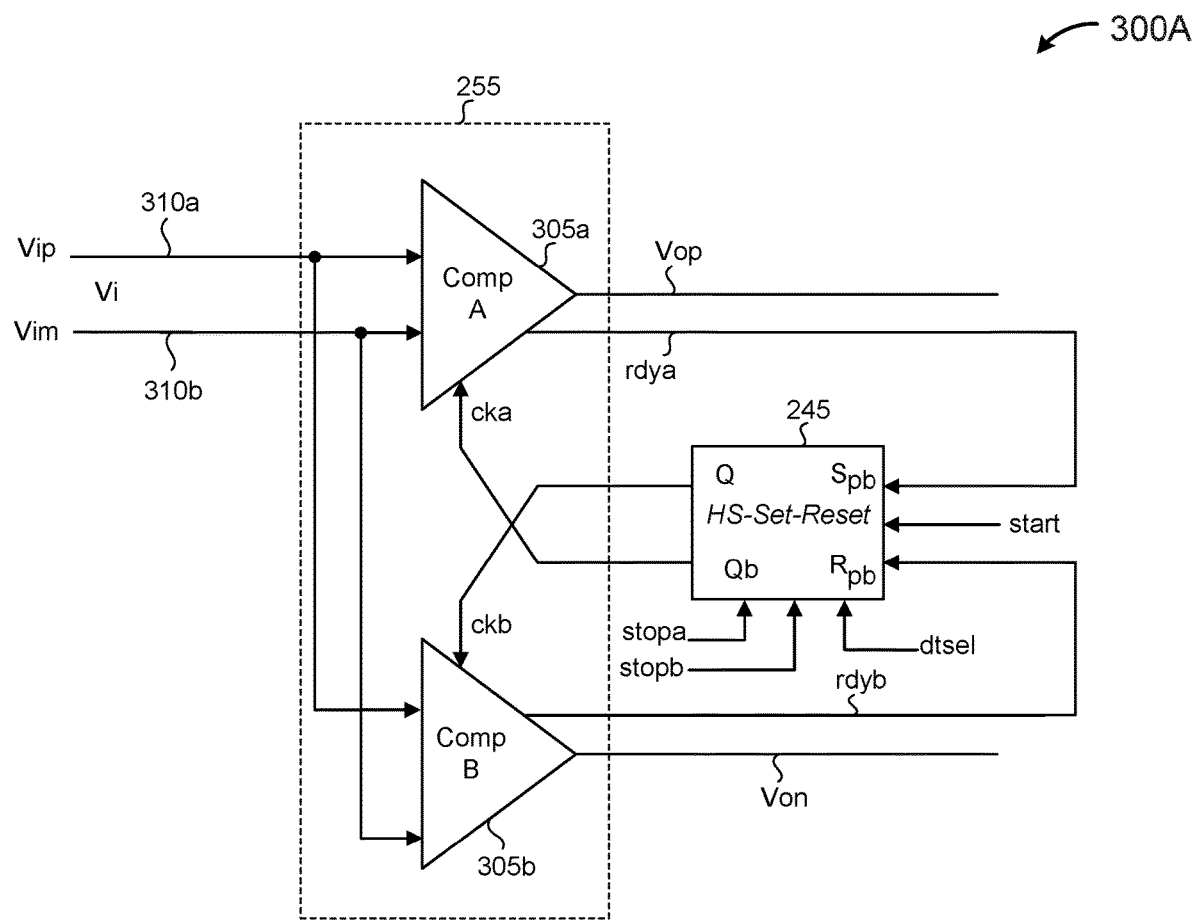
FIG. 3A depicts a block diagram of an exemplary circuit for implementing asynchronous clock signals.

FIG. 3A depicts a block diagram of an exemplary circuit for implementing asynchronous clock signals. A circuit 300A includes a first comparator 305a and a second comparator 305b. The first comparator 305a and the second comparators 305b are two time-interleaved comparators in the comparator system 255 and configured to receive the differential input signal Vi (the differential input signal Vi includes a first differential input voltage Vip and a second differential input voltage Vim). More specifically, both the first comparator 305a and the second comparator 305b receive the first differential input voltage Vip through a first conductive path 310a and a second differential input voltage Vim through a second conductive path 310b.

The circuit 300A also includes the clock generation circuit 245. The clock generation circuit 245 is configured to generate a first clock signal cka for the first comparator 305a and generate a second clock signal ckb for the second comparator 305b. The clock signals cka and ckb may trigger the comparators 305a and 305b to perform comparisons, respectively. In this depicted example, the clock generation circuit 245 includes a high-speed set-reset (HS-SR) logic circuit. The HS-SR logic circuit is enabled by a start signal. The start signal may be a synchronous clock signal from the ADC 255 to start the conversion cycles. In some embodiments, the clock generation circuit 245 may also receive a control signal dtsel to control the rising/falling edge of the generated clock signals cka and ckb. An exemplary architecture of a clock generation circuit is described in further detail with reference to FIG. 5.

Each comparator 305a, 305b generates a corresponding comparison result (e.g., Vop, Von). Each comparator 305a, 305b also generates a corresponding ready signal rdya, rdyb to indicate that a valid data is available (e.g., comparison is done) in the comparator's output. The ready signals rdya, rdyb are received by the clock generation circuit 245 to generate the clock signals cka and ckb. The clock signals cka and ckb are substantially anti-phased and are asynchronous to the reference clock. Thus, during the active phase of one compactor (e.g., comparator 305a), the other comparator (e.g., comparator 305b) in the comparator system 255 may be reset. Accordingly, the comparator's reset time may be removed from the clock generation loop to advantageously reduce SAR conversion cycles.

In some embodiments, the clock generation circuit 245 may also receive a first stop signal stopa to stop the clock signal cka and a second stop signal stopb to stop the clock signal ckb. The first stop signal stopa and the second stop signal stopb may be generated by the SAR logic circuit 260 based on the number of performed conversion cycles. In some embodiments, other compatible logic circuit may also be used to generate the stop signals. Thus, a programmable number of bits in the ADC 245 may be obtained. In addition, disabling unemployed comparators in the comparator system 255 may advantageously reduce power consumption of the ADC 245.

The circuit 300A may work as follows. For example, at the initial state (e.g., reset state), a low start signal (e.g., generated by a controller) may be used to reset the circuit 300A. The signals cka, rdya, stopa and stopb may be low, and the signals ckb, rdyb may be high, and all internal nodes of the circuit 300A may have a defined voltage (e.g., high or low). When the start signal rises from low to high, oscillation cycle may start, and the first clock signal cka may rise from low to high, and the second clock signal ckb may fall from high to low. The rising edge of the first clock signal cka may trigger the comparison on the first comparator 305a. After an input dependent delay, the comparator 305a may make a comparison decision and the ready signal rdya may rise from low to high. The rising edge of the ready signal rdya may force the first clock signal cka to fall from high to low and the second clock signal ckb to rise from low to high.

The rising edge of the second clock signal ckb may trigger the comparison on the second comparator 305b. After an input dependent delay, the comparison decision may be made and the ready signal rdyb may rise from low to high. The rising edge of the ready signal rdyb may force the first clock signal cka to rise from low to high and the second clock signal ckb to fall from high to low. The cycle may repeat itself while stop signals stopa and stopb are low and the starting signal is high. When the stop signal stopa is high, the first clock signal cka clock oscillation may be stopped. When the stop signal stopb is high, the second clock signal ckb clock oscillation may be stopped. Thus, the number of clock cycles (resolution) used in the SAR conversion may be controlled by the stop signals and may be programmable.

Figure 3B:
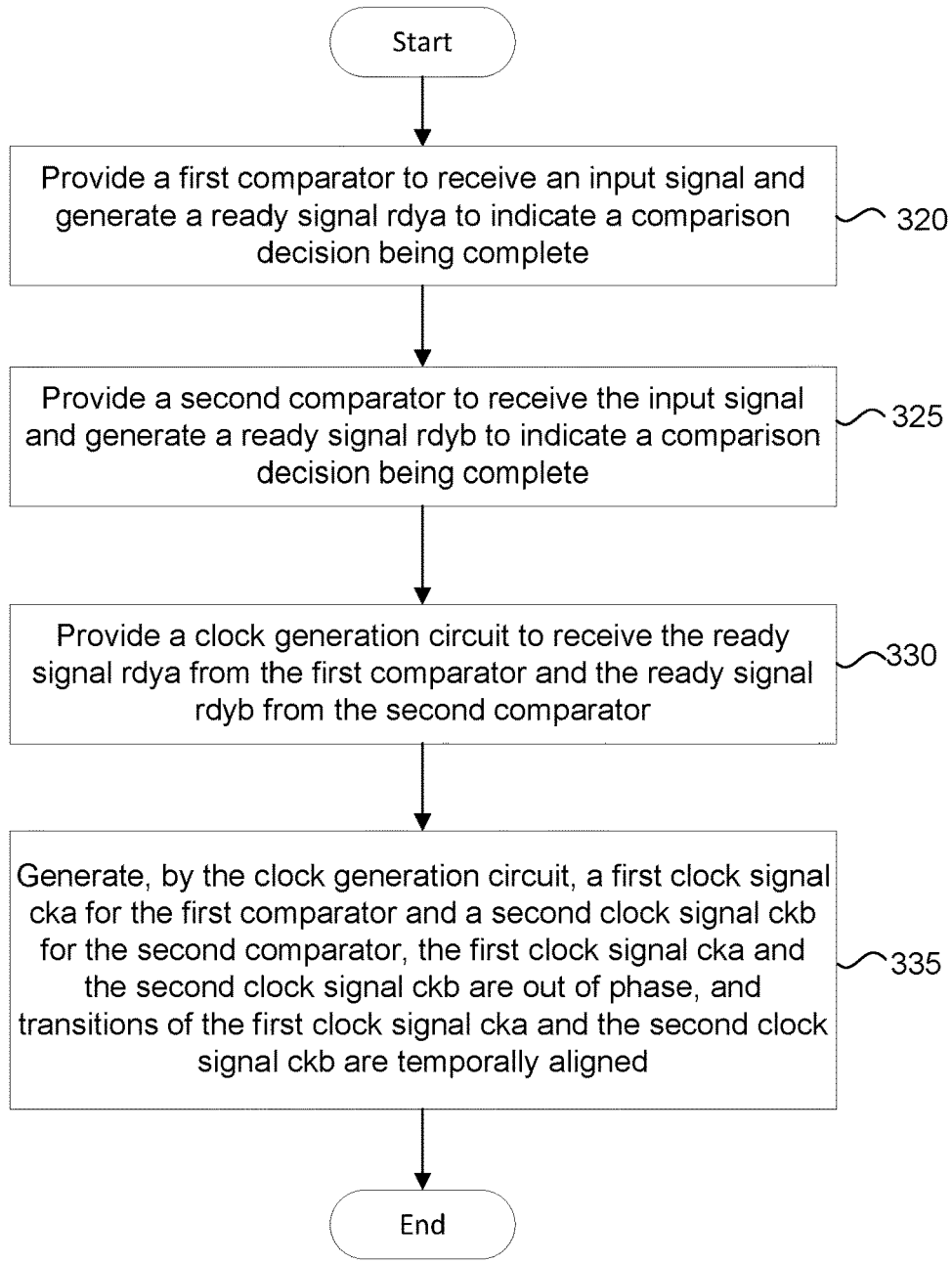
FIG. 3B depicts a flow chart of an exemplary method to implement the circuit in FIG. 3A.

FIG. 3B depicts a flow chart of an exemplary method to implement the circuit with reference to FIG. 3A. A method 300B is discussed to implement the circuit 300A described with reference to FIG. 3A. The method 300B includes, at 320, providing a first comparator (e.g., the comparator 305a) to receive an input signal (e.g., the differential input signal Vi) and generate a ready signal rdya to indicate that the first comparator 305a has completed a comparison decision. The method 300B also includes, at 325, providing a second comparator (e.g., the second comparator 305b) to receive the differential input signal Vi and generate a ready signal rdya to indicate that the second comparator 305b has completed a comparison decision.

The method 300B also includes, at 330, providing a clock generation circuit (e.g., the clock generation circuit 245) to receive the ready signal rdya from the first comparator 305a and receive the ready signal rdyb from the second comparator 305b. The method 300B also includes, at 335, generating, by the clock generation circuit 245, a first clock signal (e.g., cka) for the first comparator 305a and a second clock (e.g., ckb) signal for the second comparator 305b. The first clock signal cka and the second clock signal ckb are out of phase, and, transitions of the first clock signal cka and the second clock signal ckb are temporarily aligned.

For example, a falling edge of the first clock signal cka may substantially match a rising edge of the second clock signal ckb. Thus, voltage variations caused by the first clock signal cka at the first comparator's inputs may substantially cancel or offset voltage variations caused by the second clock signal ckb at the first comparator's inputs. Thus, the first comparator's inputs may be kept substantially stable. Similarly, the second comparator's inputs may also be kept substantially stable. Accordingly, kickback noises may be reduced, and comparison accuracy may be advantageously improved.

Figure 4A:
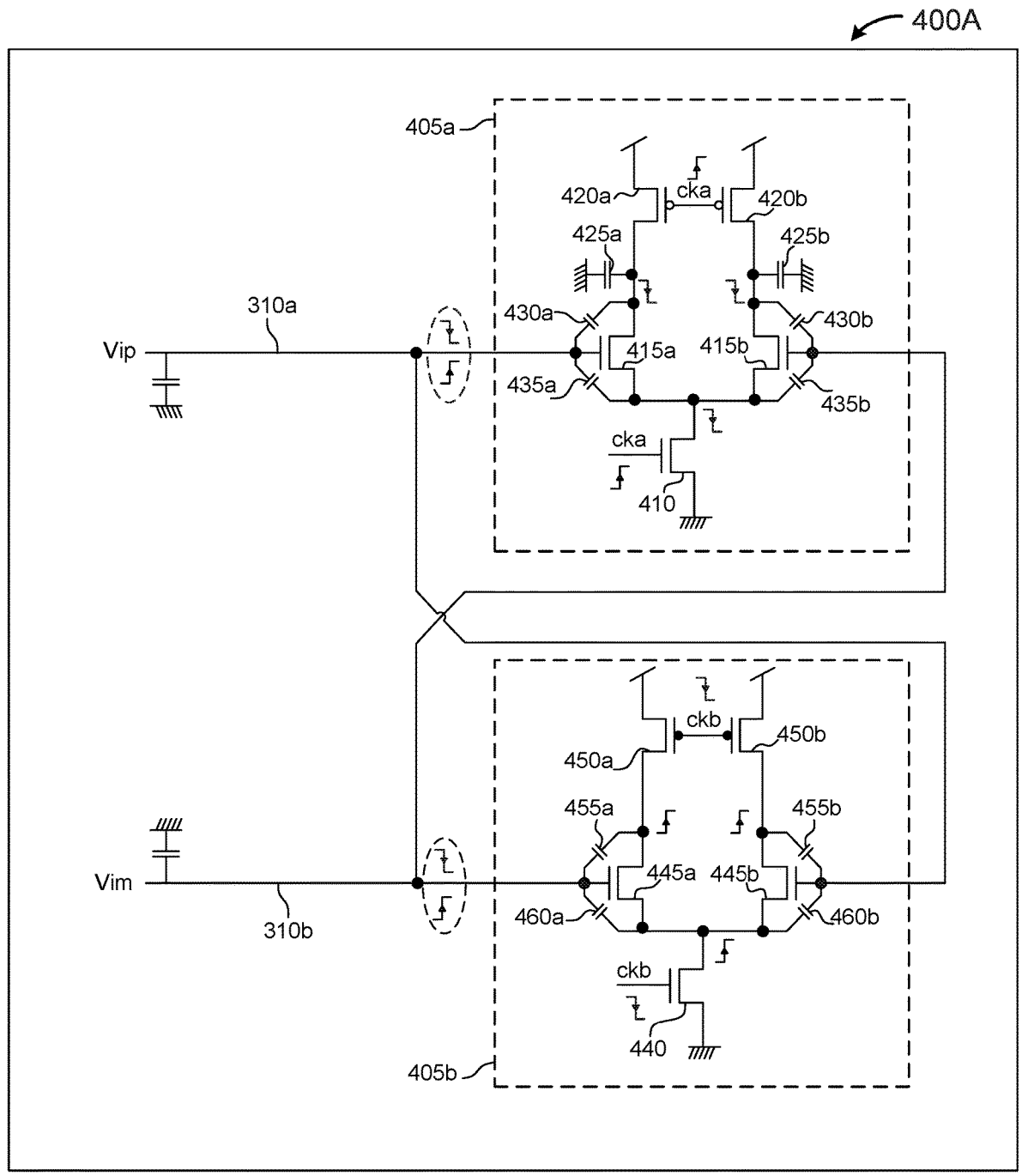
FIG. 4A depicts an architecture of an exemplary in-front preamplifier system using the asynchronous clock signals.

FIG. 4A depicts an architecture of an exemplary in-front preamplifier system using the asynchronous clock signals. The comparator system 255, as discussed with reference to FIG. 3A, includes two time-interleaved comparators 305a and 305b. The two comparators 305a and 305b, in this depicted example, include an in-front preamplifier system 400A used to attenuate kickback noise, and a latching circuit (not shown) to regenerate output voltages and deliver logic levels at comparators' outputs.

In this depicted example, the preamplifier system 400A includes a first preamplifier 405a and a second preamplifier 405b. The first preamplifier 405a includes a first transistor 410 whose gate is controlled by the first clock signal cka. In this depicted example, the first transistor 410 is an N-type metal-oxide-semiconductor field-effect-transistor (NMOSFET). The first preamplifier 405a also includes a first differential pair of NMOSFETs 415a, 415b. The drain of the NMOSFET 410 is commonly connected to the sources of the first differential pair of NMOSFETs 415a, 415b. The gate of the NMOSFET 415a is configured to receive the first differential input voltage Vip through the first conductive path 310a, and the gate of the NMOSFET 415b is configured to receive the second differential input voltage Vim through the second conductive path 310b.

The first preamplifier 405a also includes a first pair of P-type MOSFETs (PMOSFETs) 420a, 420b. Sources of the first pair of PMOSFETs 420a, 420b are connected to a power supply. The gates of the first pair of PMOSFETs 420a, 420b are connected together and controlled by the first clock signal cka. The drain of PMOSFET 420a is connected to the drain of NMOSFET 415a, and the drain of PMOSFET 420b is connected to the drain of NMOSFET 415b. The first pair of PMOSFETs 420a and 420b may be connected as switches and may be used as a switching-capacitance load. Parasitic capacitors of the first preamplifier 405a are also shown. For example, capacitor 425a and capacitor 425b may be used to show wire parasitic capacitance between the PMOSFET 420a and the NMOSFET 415a and wire parasitic capacitance between the PMOSFET 420b and the NMOSFET 415b, respectively. The capacitor 425a and capacitor 425b may integrate the differential current from the first differential pair of NMOSFETs 415a, 415b, during the sampling period (clock rising edge). As a result, a differential voltage may be generated at the inputs of the comparator's next stage (latching stage). Parasitic capacitors of the first differential pair of NMOSFETs 415a, 415b are also shown. For example, gate-drain parasitic capacitance 430a and gate-source parasitic capacitance 435a of the NMOSFET 415a and gate-drain parasitic capacitance 430b and gate-source parasitic capacitance 435b of the NMOSFET 415b are shown in FIG. 4A.

In this depicted example, the second preamplifier 405b includes a second transistor 440 whose gate is controlled by the second clock signal ckb. In this depicted example, the second transistor 440 is an N-type metal-oxide-semiconductor field-effect-transistor (NMOSFET). The second preamplifier 405b also includes a second differential pair of NMOSFETs 445a, 445b. The drain of the NMOSFET 440 is commonly connected to the sources of the second differential pair of NMOSFETs 445a, 445b. The gate of the NMOSFET 445a is also coupled to the gate of the NMOSFET 415b and configured to receive the second differential input voltage Vim from the second conductive path 310b, and the gate of the NMOSFET 445b is also coupled to the gate of the NMOSFET 415a and configured to receive the first differential input voltage Vip from the first conductive path 310a.

The second preamplifier 405b also includes a second pair of P-type MOSFETs (PMOSFETs) 450a, 450b. Sources of the second pair of PMOSFETs 450a, 450b are connected to the power supply. The gates of the second pair of PMOSFETs 450a, 450b are connected together and controlled by the second clock signal ckb. The drain of PMOSFET 450a is connected to the drain of NMOSFET 445a, and the drain of PMOSFET 450b is connected to the drain of NMOSFET 445b.

Parasitic capacitors of the second differential pair of NMOSFETs 445a, 445b are also shown. For example, gate-drain parasitic capacitance 455a and gate-source parasitic capacitance 460a of the NMOSFET 445a and gate-drain parasitic capacitance 455b and gate-source parasitic capacitance 460b of the NMOSFET 445b are shown in FIG. 4A. The parasitic capacitances of the first differential pair of NMOSFETs 415a, 415b and the second differential pair of NMOSFETs 445a, 445b may also be responsible for the kickback noise at the inputs Vip, Vim.

Rising and falling waveforms for the first clock signal cka and the second clock signal ckb may be as close from simultaneous as possible to generate symmetrical/differential kickback noise at the comparators' inputs and mitigate the common mode variations related to the kickback noise. For example, when the rising edge of the first clock signal cka and the falling edge of the second clock signal ckb substantially happens simultaneously, the rising edge of the first clock signal ckb may cause the gate voltage of the NMOSFET 415b fall and then cause the gate voltage of the NMOSFET 445a fall, and the falling edge of the second clock signal ckb may cause gate voltage of the NMOSFETs 445a rise from low to high. Thus, at the gate input of the NMOSFET 445a, the rising caused by the change of the second clock signal ckb may offset the falling caused by the first clock signal cka. According, the gate inputs of the NMOSFET 445a may be kept substantially constant. Similarly, gate inputs of the NMOSFETs 445b, 415a, and 415b may also be kept substantially stable. Thus, kickback noises at the two comparators' inputs may advantageously be reduced. Accordingly, comparison accuracy may be advantageously improved.

Figure 4B:
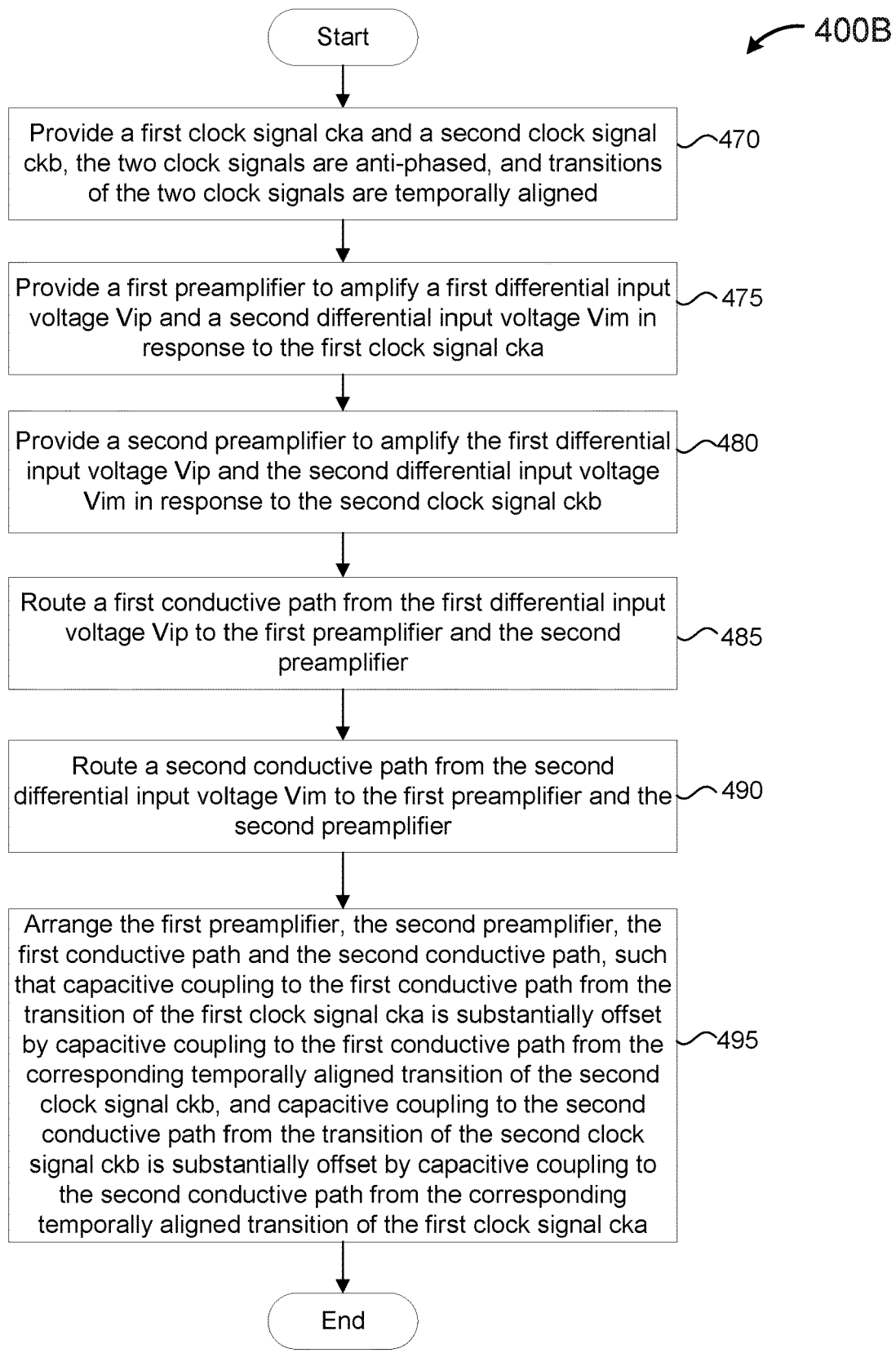
FIG. 4B depicts a flow chart of an exemplary method to implement the exemplary in-front preamplifier system described with reference to FIG. 4A.

FIG. 4B depicts a flow chart of an exemplary method to implement the exemplary in-front preamplifier system described with reference to FIG. 4A. A method 400B is discussed to implement the two preamplifiers 405a and 405b using two asynchronous clock signals. The method 400B includes, at 470, providing a first clock signal (e.g., the first clock signal cka) and providing a second clock signal (e.g., the second clock signal ckb). The first clock signal cka and the second clock signal ckb are out of phase, and transitions of the two clock signals are temporally aligned. The method 400B also includes, at 475, providing a first preamplifier (e.g., the first preamplifier 405a) to amplify a first differential input voltage Vip and a second differential input voltage Vim in response to the first clock signal cka. The method 400B also includes, at 480, providing a second preamplifier (e.g., the second preamplifier 405b) to amplify the first differential input voltage Vip and the second differential input voltage Vim in response to the second clock signal ckb. The method 400B also includes, at 485, routing a first conductive path (e.g., the first conductive path 310a) from the first differential input voltage Vip to the first preamplifier 405a and the second preamplifier 405b. The method 400B also includes, at 490, routing a second conductive path (e.g., the second conductive path 310b) from the second differential input voltage Vim to the first preamplifier 405a and the second preamplifier 405b.

The method 400B also includes, at 495, arranging the first preamplifier 405a, the second preamplifier 405b, the first conductive path 310a and the second conductive path 310b, such that capacitive coupling to the first conductive path 310a from the transition of the first clock signal cka is substantially offset by capacitive coupling to the first conductive path 310a from the corresponding temporally aligned transition of the second clock signal ckb, and capacitive coupling to the second conductive path 310b from the transition of the second clock signal ckb is substantially offset by capacitive coupling to the second conductive path 310b from the corresponding temporally aligned transition of the first clock signal cka. Thus, comparators' inputs may be kept substantially stable. Thus, kickback noises at the two comparators' inputs may advantageously be reduced. Accordingly, comparison accuracy may be advantageously improved.

FIG. 5 depicts an architecture of an exemplary clock generation circuit used to generate the asynchronous clock signals. In this depicted example, the clock generation circuit 245 includes two half-cell circuits. A first half-cell 500a is configured to receive the ready signal rdya from the first comparator 305a. A second half-cell is configured to receive the ready signal rdyd from the second comparator 305b.

The first half-cell 500a includes a first stopping circuit 510a configured to stop generating the second clock signal ckb. The first stopping circuit 510a includes a NOR gate $NR_0$. The NOR gate $NR_0$ receives an inverted start signal starti and the stop signal stopb. An inverter $INV_1$ is coupled to the output of the NOR gate $NR_0$. The first stopping circuit 510a also includes a first transmission gate consisting of an NMOSFET $M_{N3}$ and an PMOSFET $M_{P5}$. The gate of the NMOSFET $M_{N3}$ is connected to the output of the NOR gate $NR_0$ and the gate of PMOSFET $M_{P5}$ is connected to the output of the inverter $INV_1$. The first transmission gate receives the ready signal rdya from the first comparator 305a. The output of the first transmission gate is defined as signal rdyai and the signal rdyai is controlled by the first stopping circuit 510a. The signal rdybi depends on the start signal, the stop signal stopa, and the ready signal rdyb from the second comparator 305b.

More specifically, the gate of an NMOSFET $M_{N5}$ is coupled to the output of the inverter $INV_1$. The source of the NMOSFET $M_{N5}$ is connected to a predetermined reference voltage (e.g., ground). The output of the first transmission gate and the drain of the NMOSFET $M_{N5}$ are both connected to a node $n_{1a}$. By controlling the inverted start signal starti and the stop signal stopb, the first transmission gate may be opened or closed to change the signal at the node $n_{1a}$. For example, when the inverted start signal starti is low and the stop signal stopb is low, the first transmission gate may pass the ready signal rdya to the node $n_{1a}$. When either the inverted start signal starti or the stop signal stopb is high, the first transmission gate may not pass the ready signal rdya to the node $n_{1a}$.

The first half-cell 500a also includes an NMOSFET $M_{N0}$. The gate of the NMOSFET $M_{N0}$ is coupled to the node $n_{1a}$. The source of the NMOSFET $M_{N0}$ is coupled to a reference voltage (e.g., ground), and the drain of the NMOSFET $M_{N0}$ is coupled to a node $n_{2a}$. The first half-cell 500a also includes an NMOSFET $M_{N2}$ configured to reset the half-cell 500a. The gate of the NMOSFET $M_{N2}$ is coupled to receive the inverted start signal starti. The source of the NMOSFET $M_{N2}$ is coupled to ground, for example, and the drain of the NMOSFET $M_{N2}$ is also coupled to the node $n_{2a}$.

The first half-cell 500a also includes a PMOSFET $M_{P0}$ connected with a PMOSFET $M_{P2}$ in series. The drain of the PMOSFET $M_{P0}$ is coupled to the node $n_{2a}$. The gate of the PMOSFET $M_{P2}$ is coupled to a node $n_{3a}$. The first half-cell 500a also includes a capacitor $Cap_0$. One terminal of the capacitor $Cap_0$ is coupled to ground, for example, and the other terminal of the capacitor $Cap_0$ is coupled to the node $n_{3a}$. The first half-cell 500a also includes a delay line coupled between the node $n_{3a}$ and the gate of the PMOSFET $M_{P2}$ to introduce delay on the rest of the half-cell 500a. The source of the PMOSFET $M_{P2}$ is powered by a voltage supply $V_{DD}$, for example. The delay line includes a number of inverters (e.g., $INV_3$, $INV_4$, $INV_5$, $INV_6$, and $INV_{11}$). One terminal of a resistor $Res_0$ is coupled to the inverters $INV_3$, $INV_4$, $INV_5$ and $INV_6$ to introduce delay. The other terminal of the resistor $Res_0$ is coupled to $V_{DD}$, for example.

The first half-cell 500a also includes a NAND gate $ND_0$. The NAND gate $ND_0$ receives a signal rdybi from a node $n_{1b}$ in the second half-cell 500b. The signal rdybi is controlled by a second stopping circuit 510b in the second half-cell 500b. The output of the NAND gate $ND_0$ is also coupled to the node $n_{3a}$. One terminal of a variable resistor $Res_1$ is coupled to the NAND gate $ND_0$ to adjust the delay, the other terminal of the variable resistor $Res_1$ is coupled to ground, for example. The resistance of the variable resistor $Res_1$ is controlled by a signal dtsel_a (e.g., the control signal dtsel). By changing the resistance variable resistor $Res_1$, current flows through the NAND gate $ND_0$ may be changed and thus delay may be controlled.

The first half-cell 500a also includes a capacitor $Cap_1$. One terminal of the capacitor $Cap_1$ is coupled to ground, for example, and the other terminal of the capacitor $Cap_1$ is coupled to the node $n_{2a}$. The first half-cell 500a also includes a NAND gate $ND_2$. One input of the NAND gate $ND_2$ is coupled to the node $n_{2a}$ to receive a signal hiz_b and the other input of the NAND gate $ND_2$ is coupled to receive the start signal to generate the second clock signal ckb. The second clock signal ckb may be used to trigger the second comparator 305b.

The second half-cell 500b has a mirror-imaged structure as the first half-cell 500b except the flowing differences. The second half-cell 500b includes an extra inverter $INV_0$ to invert the start signal to the inverted start signal starti. The second half-cell 500b includes a NAND gate ND1. The NAND gate $ND_1$ receives the inverted start signal starti and the signal rdyai at the node $n_{1a}$. One terminal of a variable resistor Res4 is also coupled to the NAND gate $ND_1$. By controlling the resistance of the variable resistor Res4, current flows through the NAND gate $ND_1$ may be changed and thus delay may be controlled. The second half-cell 500b also includes a NAND gate ND3. The NAND gate ND3 receives a signal hiz_a at node n2b to generate the clock signal cka for the first comparator 305a.

More specifically, the second half-cell 500b includes a second stopping circuit 510b configured to stop the first clock signal cka. The first stopping circuit 510a includes a NOR gate $NR_1$. The NOR gate $NR_1$ receives the inverted start signal starti and the stop signal stopa. An inverter $INV_0$ is used to receive the start signal and generate the inverted start signal starti.

An inverter $INV_2$ is coupled to the output of the NOR gate $NR_1$. The gate of an NMOSFET $M_{N6}$ is coupled to the output of the inverter $INV_2$. The source of the NMOSFET $M_{N6}$ is connected to a predetermined reference voltage (e.g., ground). The second stopping circuit 510b also includes a second transmission gate consisting of an NMOSFET $M_{N4}$ and an PMOSFET $M_{P6}$. The gate of the NMOSFET $M_{N4}$ is connected to the output of the NOR gate $NR_1$ and the gate of PMOSFET $M_{P6}$ is connected to the output of the inverter $INV_2$. The second transmission gate receives the ready signal rdyb from the second comparator 305b. The output of the second transmission gate and the drain of the NMOSFET $M_{N4}$ are both connected to a node $n_{1b}$. A signal rdybi is the signal at the node $n_{1b}$. The signal rdybi depends on the start signal, the stop signal stopa, and the ready signal rdyb from the second comparator 305b.

The second half-cell 500b also includes an NMOSFET $M_{N1}$. The gate of the NMOSFET $M_{N1}$ is coupled to the node $n_{1b}$. The source of the NMOSFET $M_{N1}$ is coupled to a reference voltage (e.g., ground), and the drain of the NMOSFET $M_{N1}$ is coupled to a node $n_{2b}$. The second half-cell 500b also includes a PMOSFET $M_{P4}$ configured to reset the half-cell 500b. The gate of the PMOSFET $M_{P4}$ is coupled to receive the start signal. The source of the PMOSFET $M_{P4}$ is coupled to $V_{DD}$, for example, and the drain of the PMOSFET $M_{P4}$ is also coupled to the node $n_{2b}$.

The second half-cell 500b also includes a PMOSFET $M_{P1}$ connected with a PMOSFET $M_{P3}$ in series. The drain of the PMOSFET $M_{P1}$ is coupled to the node $n_{2b}$. The gate of the PMOSFET $M_{P1}$ is coupled to a node $n_{3b}$. The second half-cell 500b also includes a capacitor $Cap_2$. One terminal of the capacitor $Cap_2$ is coupled to ground, for example, and the other terminal of the capacitor $Cap_2$ is coupled to the node $n_{3b}$. The second half-cell 500b also includes a delay line coupled between the node $n_{3b}$ and the gate of the PMOSFET $M_{P4}$ to introduce delay on the rest of the half-cell 500b. The source of the PMOSFET $M_{P3}$ is powered by a voltage supply $V_{DD}$, for example. The delay line includes a number of inverters (e.g., $INV_7$, $INV_8$, $INV_9$, $INV_{10}$, and $INV_{12}$). One terminal of a resistor $Res_3$ is coupled to the inverters $INV_7$, $INV_8$, $INV_9$ and $INV_{10}$ to introduce delay. The other terminal of the resistor $Res_3$ is coupled to $V_{DD}$, for example.

The second half-cell 500b also includes a NAND gate $ND_1$. One input of the NAND gate $ND_1$ is coupled to the node $n_{1a}$ to receive the signal rdyai from the first half-cell 500a. The other input of the NAND gate $ND_1$ is coupled to receive the inverted start signal starti. One terminal of a variable resistor $Res_4$ is coupled to the NAND gate $ND_1$ to adjust the delay, the other terminal of the variable resistor $Res_4$ is coupled to ground, for example. The resistance of the variable resistor $Res_4$ is controlled by a signal dtsel_b (e.g., the control signal dtsel). By changing the resistance of the variable resistor $Res_4$, current flows through the NAND gate $ND_1$ may be changed and thus delay may be controlled.

The second half-cell 500b also includes a capacitor $Cap_3$. One terminal of the capacitor $Cap_3$ is coupled to ground, for example, and the other terminal of the capacitor $Cap_3$ is coupled to the node $n_{2b}$. The second half-cell 500b also includes a NAND gate $ND_3$. Both two inputs of the NAND gate $ND_3$ are coupled to the node $n_{2b}$ to receive a signal hiz_a and generate the first clock signal cka. The first clock signal cka may be used to trigger the first comparator 305a.

In this depicted example, the clock generation circuit 245 is divided into two half-cells. In some embodiments, the asynchronous clock generation circuit may be placed inside the comparators to minimize the stray capacitance on critical nets rdya and rdyb. Also, by placing resistors on the supplies of the delay lines, low power operation may be achieved due to the limitation of the maximum current through the logic gates. Moreover, by making the resistance on the NAND gate $ND_0$ and $ND_1$ variable, variable fall time delay may be available and the total delay in the clock generation circuit may be controlled. By introducing this clock generation circuit 245, comparison status (ready signals rdya, rdyb) of comparators are monitored to generate corresponding clock signals, thus, one comparator may be reset during the active phase of the other compactor. Accordingly, comparator reset time may be removed from the clock generation loop to advantageously reduce SAR conversion cycles.

In some embodiments, some part of the clock generation circuit 245 (e.g., circuit 550) may be replaced by a standard set-reset latch. For example, all the devices that are arranged above the node $n_{1a}$ and node $n_{1b}$ may be replaced by a standard SR latch. In some embodiments, sizes of transistors in the clock generation circuit 245 may be selected to make the rising/falling edge of first clock signal cka as close to the falling/rising edge of the second clock signal ckb as possible. For example, all the transistors (e.g., $M_{N0}$-$M_{N6}$, $M_{P0}$-$M_{P6}$) may have the same size.

FIG. 6 depicts a flow chart of an exemplary method to operate the circuit described with reference to FIG. 5. The operation of the clock generation circuit 245 may be performed as follows. At 605, a start signal may be set to low (e.g., by a controller) to initialize the clock generation circuit 245. At the initial state, as the start signal is set to low, the inverter $INV_0$ may lead the inverted start signal starti to be high, and the signals rdyai and rdybi may be forced to low by the NOR gates $NR_0$ and $NR_1$. Then, transistor $M_{P4}$ and $M_{N2}$ may force signal hiz_b to how and signal hiz_a to high. And, at 610, the NAND gate $ND_3$ may make the first clock signal cka to be low and NAND gate $ND_2$ may make the second clock signal ckb to be high. As the first clock signal cka is used to trigger the first comparator 305a, and the second clock signal ckb is used to trigger the second comparator 305b, the ready signal rdya generated by the first comparator 305a may still keep low, and the ready signal rdyb generated by the second comparator 305b may be forced to high.

At 615, whether the start signal is changed from low to high is monitored. When the start signal is asserted to rise from low to high, the inverted start signal starti may become low, and the NOR gate $NR_0$ may let the ready signal rdya pass to node $n_{1a}$ and the NOR gate $NR_1$ may let the ready signal rdyb pass to node $n_{1b}$. Then, the signal rdybi may rise from low to high, and the transistor $M_{N1}$ may lead the signal hiz_a to fall from high to low, and, at 620a, the NAND gate $ND_3$ may make the first clock signal cka rise from low to high. In addition, the NAND gate ND0 and the transistor $M_{p0}$ may lead the signal hiz_b to rise from low to high, and at 620b, the NAND gate $ND_2$ may make the second clock signal ckb fall from high to low. The low second clock signal ckb may make the ready signal rdyb to be low.

When the first clock signal cka rises from low to high, the first comparator 305a may start the comparison and after a valid decision is reached, the ready signal rdya may rise from low to high. And the NOR gate $NR_0$ may let the ready signal rdya pass to node $n_{1a}$ to become rdyai signal, and rdyai signal may rise from low to high. Then the transistor $M_{N0}$ may enable the signal hiz_b to fall from high to low, and at 625a, the NAND gate $ND_2$ may make the second clock signal ckb rise from low to high. The NAND gate $ND_1$ and the transistor $M_{P1}$ may force the signal hiz_a to rise from low to high, and at 625b, the NAND gate $ND_3$ may enable the first clock signal cka fall from high to low, the low first clock signal cka may force the ready signal rdya to be low.

When, at 625a, the second clock signal ckb rises from low to high, the second comparator 305b may start the comparison and after a valid decision is reached, the ready signal rdyb may rise from low to high. And the NOR gate $NR_1$ may let the ready signal rdyb pass to node $n_{1b}$ to become rdybi signal, and rdybi signal may rise from low to high. Then the transistor $M_{N1}$ may enable the signal hiz_a to fall from high to low, and, at 635b, the NAND gate $ND_3$ may make the first clock signal cka rise from low to high. The NAND gate $ND_0$ and the transistor $M_{P0}$ may force the signal hiz_b to rise from low to high, and, at 635a, the NAND gate $ND_2$ may enable the second clock signal ckb fall from high to low, the low second clock signal ckb may force the ready signal rdyb to be low.

If stop signals stopa and stopb used to stop the two comparators are not enabled, the oscillation may repeat itself until the stop signals stopa and stopb are high and/or the start signal is low. At 640, whether to stop the first comparator 305a is determined. When the first stop signal stopa used to stop the first comparator 305a is high, at 645, the NOR gate $NR_1$ and the inverter $INV_2$ may turn the transistor $M_{P6}$ and transistor $M_{N4}$ off and may turn the transistor $M_{N6}$ on. The signal rdybi may be forced to low, which may turn the transistor $M_{N1}$ off and force the signal hiz_a to stay in a high state. And, the first clock signal cka is reset to low until the low stop signal stopa is removed. At 650, whether to stop the second comparator 305b is determined. When the second stop signal stopb is high, at 655, the NOR gate $NR_0$ and the inverter $INV_1$ may turn the transistor $M_{P5}$ and transistor $M_{N3}$ off and may turn the transistor $M_{N5}$ on. The signal rdyai may be forced to low, which may turn the transistor $M_{N0}$ off and force the signal hiz_b to stay in a high state. And the second clock signal ckb is reset to low until the low stop signal stopb is removed. As both clock signal cka and ckb are stopped, the oscillation stops.

If, at 640, the first comparator 305a is not to be stopped, then, at 660, whether to stop the second comparator 305b is determined. If a user wants to stop the second comparator 305b, the second stop signal stopb is selected to be high, at 665, the NOR gate $NR_0$ and the inverter $INV_1$ may turn the transistor $M_{P5}$ and transistor $M_{N3}$ off and may turn the transistor $M_{N5}$ on. The signal rdyai may be forced to low, which may turn the transistor $M_{N0}$ off and force the signal hiz_b to stay in a high state. And the second clock signal ckb is reset to low until the low stop signal stopb is removed. At 670, whether to stop the first comparator 305a after stopped the second comparator 305a is further determined. If a user, for example, wants to further disable the first comparator 305a, the second stop signal stopb may be set to high, and at 675, the first clock signal cka is reset to low until the low stop signal stopa is removed. As both clock signal cka and ckb are stopped, the oscillation stops. Thus, the number of clock cycles (resolution) used in the SAR conversion may be controlled by the stop signals and may be programmable.

FIG. 7 depicts timing diagrams of exemplary signals in the clock generation circuit described with reference to FIG. 5. In this depicted example, the start signal, ready signals rdya and rdyb, signals rdyai and rdybi, signals hiz_b and hiz_a, and the clock signals are shown. When the start signal is high, the oscillation starts. When the start signal falls from high to low, the oscillation stops. When the start signal rises from low to high, the ready signals and clock signals may rise or fall as described in the operation of the clock generation circuit 245 with reference to FIG. 6.

Various embodiments may be implemented using reconfigurable programmable logic blocks (e.g., FPGA), other embodiments may be implemented in fixed instantiations (e.g., ASIC), or combined in a single integrated circuit (e.g., SOC) with programmable logic. While dedicated hard block circuitry in an ASIC implementation may not be reconfigurable once instantiated in an integrated circuit, for example, an ASIC implementation may, in some implementations, provide for a minimized platform with respect to, for example, power consumption and/or die area.

For example, as shown in FIG. 2, the clock generation circuit 245 is arranged on the IC 215 with the SAR logic circuit 260 and the comparator system 255. In another embodiment, the clock generation circuit 245 may be implemented in a different IC (e.g., another FPGA) to provide clock signals for the ADC 225.

In some embodiments, the clock generation circuit 245 may be implemented as hard block fixed circuitry. For example, an application specific integrated circuit (ASIC) may provide a clock generation circuit 245 with customized hardware circuitry.

In some embodiments, some or all of the functions of ADC 225 may be implemented in a processor that is configured to execute a set of instructions stored in a data store to control the data conversion. The processor may be arranged on the same IC 215. For example, the clock generation circuit 245 and the data store may be implemented in a programmable logic block of a system-on-chip (SOC) or implemented in a hard block using fixed circuitry of the SOC, and the comparator system 255 may be implemented in another hard block using, for example, fixed circuitry of the SOC.

Figure 8:
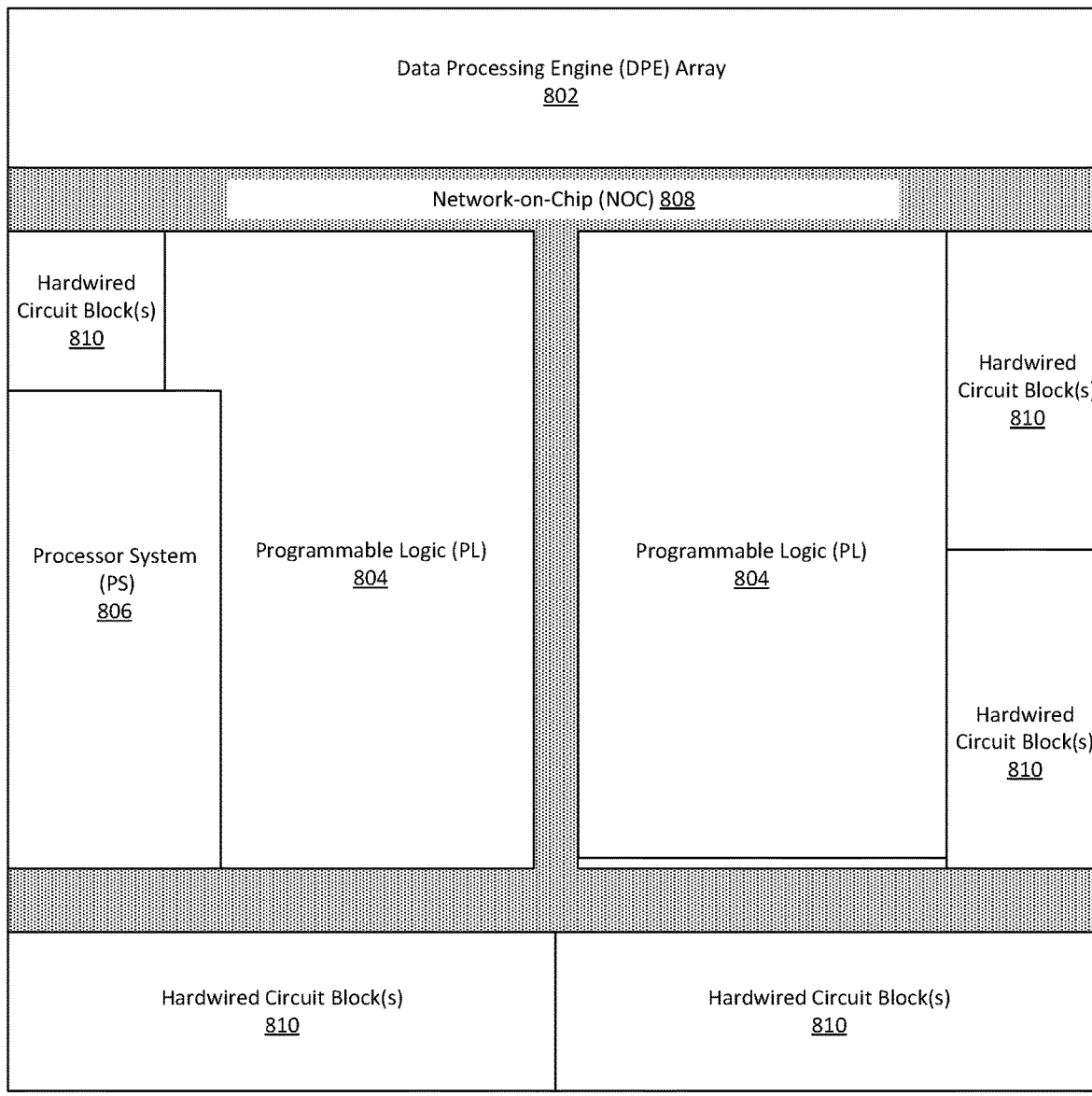
FIG. 8 depicts an exemplary System-on-Chip (SOC) architecture on which the disclosed circuits and processes may be implemented.

FIG. 8 depicts an exemplary System-on-Chip (SOC) architecture on which the disclosed circuits and processes may be implemented. SOC 800 is an example of a programmable IC and an integrated programmable device platform. In the example of FIG. 8, the various, different subsystems or regions of the SOC 800 illustrated may be implemented on a single die provided within a single integrated package. In other examples, the different subsystems may be implemented on a plurality of interconnected dies provided as a single, integrated package.

In the example, the SOC 800 includes a plurality of regions having circuitry with different functionalities. In the example, the SOC 800 optionally includes a data processing engine (DPE) array 802. SOC 800 includes programmable logic (PL) regions 804 (hereafter PL region(s) or PL), a processing system (PS) 806, a Network-on-Chip (NOC) 808, and one or more hardwired circuit blocks 810. DPE array 802 is implemented as a plurality of interconnected, hardwired, and programmable processors having an interface to the other regions of the SOC 800.

PL 804 is circuitry that may be programmed to perform specified functions. As an example, PL 804 may be implemented as field programmable gate array type of circuitry. PL 804 can include an array of programmable circuit blocks. Examples of programmable circuit blocks within PL 804 include, but are not limited to, configurable logic blocks (CLBs), dedicated random access memory blocks (BRAM and/or UltraRAM or URAM), digital signal processing blocks (DSPs), clock managers, and/or delay lock loops (DLLs).

Each programmable circuit block within PL 804 typically includes both programmable interconnect circuitry and programmable logic circuitry. The programmable interconnect circuitry typically includes a large number of interconnect wires of varying lengths interconnected by programmable interconnect points (PIPs). Typically, the interconnect wires are configured (e.g., on a per wire basis) to provide connectivity on a per-bit basis (e.g., where each wire conveys a single bit of information). The programmable logic circuitry implements the logic of a user design using programmable elements that may include, for example, look-up tables, registers, arithmetic logic, and so forth. The programmable interconnect and programmable logic circuitries may be programmed by loading configuration data into internal configuration memory cells that define how the programmable elements are configured and operate.

The PS 806 is implemented as hardwired circuitry that is fabricated as part of the SOC 800. The PS 806 may be implemented as, or include, any of a variety of different processor types each capable of executing program code. For example, PS 806 may be implemented as an individual processor, e.g., a single core capable of executing program code. In another example, PS 806 may be implemented as a multicore processor. In still another example, PS 806 may include one or more cores, modules, co-processors, interfaces, and/or other resources. PS 806 may be implemented using any of a variety of different types of architectures. Example architectures that may be used to implement PS 806 may include, but are not limited to, an ARM processor architecture, an x86 processor architecture, a GPU architecture, a mobile processor architecture, a DSP architecture, or other suitable architecture that is capable of executing computer-readable instructions or program code.

NOC 808 includes an interconnecting network for sharing data between endpoint circuits in SOC 800. The endpoint circuits can be disposed in DPE array 802, PL regions 804, PS 806, and/or in hardwired circuit blocks 810. NOC 808 can include high-speed data paths with dedicated switching. In an example, NOC 808 includes horizontal paths, vertical paths, or both horizontal and vertical paths. The arrangement and number of regions shown in FIG. 8 is merely an example. The NOC 808 is an example of the common infrastructure that is available within the SOC 800 to connect selected components and/or subsystems.

NOC 808 provides connectivity to PL 804, PS 806, and to selected ones of the hardwired circuit blocks 810. NOC 808 is programmable. In the case of a programmable NOC used with other programmable circuitry, the nets that are to be routed through NOC 808 are unknown until a user circuit design is created for implementation within the SOC 800. NOC 808 may be programmed by loading configuration data into internal configuration registers that define how elements within NOC 808 such as switches and interfaces are configured and operate to pass data from switch to switch and among the NOC interfaces.

NOC 808 is fabricated as part of the SOC 800 and while not physically modifiable, may be programmed to establish connectivity between different master circuits and different slave circuits of a user circuit design. NOC 808, for example, may include a plurality of programmable switches that are capable of establishing packet switched network connecting user specified master circuits and slave circuits. In this regard, NOC 808 is capable of adapting to different circuit designs, where each different circuit design has different combinations of master circuits and slave circuits implemented at different locations in the SOC 800 that may be coupled by NOC 808. NOC 808 may be programmed to route data, e.g., application data and/or configuration data, among the master and slave circuits of the user circuit design. For example, NOC 808 may be programmed to couple different user-specified circuitry implemented within PL 804 with PS 806, and/or DPE array 802, with different hardwired circuit blocks, and/or with different circuits and/or systems external to the SOC 800.

The hardwired circuit blocks 810 may include input/output (I/O) blocks, and/or transceivers for sending and receiving signals to circuits and/or systems external to SOC 800, memory controllers, or the like. Examples of different I/O blocks may include single-ended and pseudo differential I/Os and high-speed differentially clocked transceivers. Further, the hardwired circuit blocks 810 may be implemented to perform specific functions. Examples of hardwired circuit blocks 810 include, but are not limited to, cryptographic engines, digital-to-analog converters, analog-to-digital converters, and the like. The hardwired circuit blocks 810 within the SOC 800 may be referred to herein from time-to-time as application-specific blocks.

In the example of FIG. 8, PL 804 is shown in two separate regions. In another example, PL 804 may be implemented as a unified region of programmable circuitry. In still another example, PL 804 may be implemented as more than two different regions of programmable circuitry. The particular organization of PL 804 is not intended as a limitation. In this regard, SOC 800 includes one or more PL regions 804, PS 806, and NOC 808. DPE array 802 may be optionally included.

In other example implementations, the SOC 800 may include two or more DPE arrays 802 located in different regions of the IC. In still other examples, the SOC 800 may be implemented as a multi-die IC. In that case, each subsystem may be implemented on a different die. The different dies may be communicatively linked using any of a variety of available multi-die IC technologies such stacking the dies side-by-side on an interposer, using a stacked-die architecture where the IC is implemented as a Multi-Chip Module (MCM), or the like. In the multi-die IC example, it should be appreciated that each die may include single subsystem, two or more subsystems, a subsystem and another partial subsystem, or any combination thereof.

A programmable integrated circuit (IC) refers to a type of device that includes programmable logic. An example of a programmable device or IC is a field programmable gate array (FPGA). An FPGA is characterized by the inclusion of programmable circuit blocks. Examples of programmable circuit blocks include, but are not limited to, input/output blocks (IOBs), configurable logic blocks (CLBs), dedicated random access memory blocks (BRAM), digital signal processing blocks (DSPs), processors, clock managers, and delay lock loops (DLLs). Modern programmable ICs have evolved to include programmable logic in combination with one or more other subsystems. For example, some programmable ICs have evolved into System-on-Chips or "SOCs" that include both programmable logic and a hardwired processor. Other varieties of programmable ICs include additional and/or different subsystems.

Although various embodiments have been described with reference to the figures, other embodiments are possible. For example, in some embodiments, the clock generation circuit may be used in SERDES that implements ping pong amplifiers. In some embodiments, decision feedback equalizers (DFEs) that uses an adder may be replaced, the adder may be divided in two, and two asynchronous clock signals may be used to control the signal processing. In some embodiments, instead of using comparators as delay lines, fixed delay lines may be used in the circuit 300A.

Various examples may be implemented using circuitry, including various electronic hardware. By way of example and not limitation, the hardware may include transistors, resistors, capacitors, switches, integrated circuits and/or other devices. In various examples, the circuits may include analog and/or digital logic, discrete components, traces and/or memory circuits fabricated on a silicon substrate including various integrated circuits (e.g., FPGAs, ASICs). In some embodiments, the circuits may involve execution of preprogrammed instructions and/or software executed by a processor. For example, various systems may involve both hardware and software.

Some aspects of embodiments may be implemented as a computer system. For example, various implementations may include digital and/or analog circuitry, computer hardware, firmware, software, or combinations thereof. Apparatus elements can be implemented in a computer program product tangibly embodied in an information carrier, e.g., in a machine-readable storage device, for execution by a fixed hardware processor; and methods can be performed by a programmable processor executing a program of instructions to perform functions of various embodiments by operating on input data and generating an output. Some embodiments may be implemented advantageously in one or more computer programs that are executable on a programmable system including at least one processor coupled to receive data and instructions from, and to transmit data and instructions to, a data store, at least one input, and/or at least one output. A data store may include one or more registers or memory locations in, for example, a memory space. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other units suitable for use in a computing environment.

In various embodiments, a computer system may include non-transitory memory. The memory may be connected to the one or more processors, which may be configured for storing data and computer readable instructions, including processor executable program instructions. The data and computer readable instructions may be accessible to the one or more processors. The processor executable program instructions, when executed by the one or more processors, may cause the one or more processors to perform various operations.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are within the scope of the following claims.

What is claimed is:

1. A circuit, comprising:
   a first comparator configured to receive an input signal and generate a first ready signal to indicate a comparison decision being complete;
   a second comparator configured to receive the input signal and generate a second ready signal to indicate a comparison decision being complete; and,
   a clock generation circuit configured to receive the first ready signal and the second ready signal and generate a first clock signal for the first comparator and a second clock signal for the second comparator,
   wherein, rising edges and falling edges of the first clock signal are substantially aligned with falling edges and rising edges of the second clock signal, respectively and wherein the clock generation circuit is configured to receive a first stop signal to stop the generation of the first clock signal, and the clock generation circuit is further configured to receive a second stop signal to stop the generation of the second clock signal, wherein the first stop signal and the second stop signal are independently controllable.

2. The circuit of claim 1, wherein the first comparator and the second comparator comprise time-interleaved comparators.

3. The circuit of claim 1, wherein the clock generation circuit is controlled by an oscillation start signal.

4. The circuit of claim 1, wherein the first stop signal and the second stop signal are generated by a successive approximation register (SAR) logic circuit of an analog-to-digital converter (ADC).

5. The circuit of claim 1, wherein the clock generation circuit is further configured to receive a control signal to control transitions of the first clock signal and the second clock signal.

6. The circuit of claim 5, wherein the clock generation circuit comprises:
a first circuit configured to generate the second clock signal in response to the first ready signal, the second ready signal, and an inverted oscillation start signal; and,
a second circuit configured to generate the first clock signal in response to the first ready signal the second ready signal, and the oscillation start signal.

7. The circuit of claim 6, wherein the first circuit comprises:
a first stop circuit comprising a first transmission gate configured to receive the first ready signal, the first transmission gate comprises:
a first NMOSFET configured to receive an output of a first NOR gate, and,
a first PMOSFET configured to receive an inverted output of the first NOR gate,
wherein, the first NOR gate is configured to receive the inverted oscillation start signal and the second stop signal.

8. The circuit of claim 7, wherein the first circuit further comprises:
(a) a first NAND gate coupled to an output of a second stop circuit, wherein the second stop circuit comprises a second transmission gate configured to receive the second ready signal, the second transmission gate comprises a second NMOSFET ($M_{N4}$) configured to receive an output of a second NOR gate ($NR_1$), and a second PMOSFET configured to receive an inverted output of the second NOR gate, the second NOR gate is configured to receive the inverted oscillation start signal and the first stop signal;
(b) a third NMOSFET, wherein the gate of the third NMOSFET is coupled to the output of the first transmission gate, and the source of the third NMOSFET is coupled to a reference voltage;
(c) a third PMOSFET, wherein the source of the third PMOSFET is coupled to a power supply voltage;
(d) a plurality of inverters arranged between an output of the first NAND gate and the gate of the third PMOSFET;
(e) a fourth PMOSFET, wherein the source of the fourth PMOSFET is coupled to the drain of the third PMOSFET, the gate of the fourth PMOSFET is coupled to the output of the first NAND gate, and the drain of the fourth PMOSFET is coupled to the drain of the third NMOSFET; and,
(f) a second NAND gate configured to generate the second clock signal, wherein one input of the second NAND gate is coupled to the drain of the fourth PMOSFET, and the other input of the second NAND gate is configured to receive the oscillation start signal.

9. The circuit of claim 8, wherein the first circuit further comprises:
a fourth NMOSFET, the gate of the fourth NMOSFET is coupled to receive the inverted oscillation start signal, the source of the fourth NMOSFET is coupled to the reference voltage, and the drain of the fourth NMOSFET is coupled to the drain of the fourth PMOSFET.

10. The circuit of claim 8, wherein the first circuit further comprises: a variable resistor having two terminals, one of the two terminals is coupled to the reference voltage, and the other terminal of the two terminals is coupled to the first NAND gate, the resistance of the variable resistor is controlled by the control signal.

11. The circuit of claim 8, wherein the second circuit further comprises:
(a) a third NAND gate having a first input and a second input, the first input is coupled to an output of the first stop circuit, and the second input is coupled to receive the inverted oscillation start signal;
(b) a fifth NMOSFET, wherein the gate of the fifth NMOSFET is coupled to the output of the second transmission gate, and the source of the fifth NMOSFET is coupled to the reference voltage;
(c) a fifth PMOSFET, wherein the source of the fifth PMOSFET is coupled to the power supply voltage;
(d) a plurality of inverters arranged between an output of the third NAND gate and the gate of the fifth PMOSFET;
(e) a sixth PMOSFET, wherein the source of the sixth PMOSFET is coupled to the drain of the fifth PMOSFET, the gate of the sixth PMOSFET is coupled to the output of the third NAND gate (NM), and the drain of the sixth PMOSFET is coupled to the drain of the fifth NMOSFET; and,
(f) a fourth NAND gate configured to generate the first clock signal, wherein both two inputs of the fourth NAND gate are coupled to the drain of the fifth NMOSFET.

12. A method, comprising:
providing a first comparator to receive an input signal and generate a first ready signal to indicate a comparison decision being complete;
providing a second comparator to receive the input signal and generate a second ready signal to indicate a comparison decision being complete;
providing a clock generation circuit configured to receive the first ready signal and the second ready signal;
generating, by the clock generation circuit, a first clock signal for the first comparator and a second clock signal for the second comparator;
receiving, by the clock generation circuit, a first stop signal to stop the generation of the first clock signal; and,
receiving, by the clock generation circuit, a second stop signal to stop the generation of the second clock signal,
wherein, rising edges and falling edges of the first clock signal are substantially aligned with falling edges and rising edges of the second clock signal, respectively, wherein the first stop signal and the second stop signal are independently controllable.

13. The method of claim 12, wherein the first comparator and the second comparator (305b) comprise time-interleaved comparators.

14. The method of claim 12, wherein the clock generation circuit is controlled by an oscillation start signal.

15. The method of claim 12, further comprising:
generating, by a successive approximation register (SAR) logic circuit of an analog-to-digital converter (ADC), the first stop signal and the second stop signal.

16. The method of claim 12, further comprising:
receiving, by the clock generation circuit, a control signal to control transitions of the first clock signal and the second clock signal.

* * * * *